United States Patent
Kaga

(10) Patent No.: US 10,250,224 B2
(45) Date of Patent: Apr. 2, 2019

(54) PIEZOELECTRIC VIBRATING PIECE AND PIEZOELECTRIC DEVICE

(71) Applicant: NIHON DEMPA KOGYO CO., LTD., Tokyo (JP)

(72) Inventor: Shigetaka Kaga, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 343 days.

(21) Appl. No.: 15/318,361

(22) PCT Filed: Jun. 12, 2015

(86) PCT No.: PCT/JP2015/067014
§ 371 (c)(1),
(2) Date: Dec. 13, 2016

(87) PCT Pub. No.: WO2015/194474
PCT Pub. Date: Dec. 23, 2015

(65) Prior Publication Data
US 2017/0126199 A1    May 4, 2017

(30) Foreign Application Priority Data

Jun. 16, 2014   (JP) .................................. 2014-123198
Jun. 1, 2015    (JP) .................................. 2015-111275

(51) Int. Cl.
*H03H 9/19*    (2006.01)
*H03H 9/02*    (2006.01)

(52) U.S. Cl.
CPC .......... *H03H 9/19* (2013.01); *H03H 9/02023* (2013.01); *H03H 9/02157* (2013.01)

(58) Field of Classification Search
CPC ....................................................... H03H 9/19
See application file for complete search history.

(56) References Cited

U.S. PATENT DOCUMENTS 4,344,010 A  *  8/1982  Vig .......................... H03H 9/58
                                                    310/315
2009/0252983 A1*  10/2009  Hara .................... H03H 9/0514
                                                    428/596

(Continued)

FOREIGN PATENT DOCUMENTS

JP    H04123605    4/1992
JP    H06085598    3/1994

(Continued)

OTHER PUBLICATIONS

"International Search Report (Form PCT/ISA/210) of PCT/JP2015/067014", dated Jul. 21, 2015, with English translation thereof, pp. 1-2.

*Primary Examiner* — J. San Martin
(74) *Attorney, Agent, or Firm* — JCIPRNET

(57) ABSTRACT

A piezoelectric vibrating piece includes a vibrating piece body and at least a pair of excitation electrodes. The vibrating piece body includes a vibrator. The pair of excitation electrodes are formed on respective front surface and back surface of the vibrator. The vibrating piece body is a twice rotated quartz-crystal vibrating piece cut out parallel to an X"-Z" surface. The X"-Z" surface is rotated around a Z-axis of a crystallographic axis of a crystal and further rotated around an X'-axis. The pair of excitation electrodes are collocated in a Z"'-axis direction determined by an X"'-axis. The X"'-axis is defined by counterclockwise rotation from a +X"-axis direction around a Y"-axis by 260° to 300°. The pair of excitation electrodes are disposed inclined with respect to the Y"-axis direction.

9 Claims, 32 Drawing Sheets

(56) References Cited

U.S. PATENT DOCUMENTS

2010/0231092 A1* 9/2010 Andle .................... H03H 9/177
　　　　　　　　　　　　　　　　　　　　　　　310/333
2017/0302249 A1* 10/2017 Obara ..................... H03H 9/17
2018/0115301 A1* 4/2018 Kaga ..................... H01L 41/047

FOREIGN PATENT DOCUMENTS

| JP | H09181561 | 7/1997 |
| JP | 2004096569 | 3/2004 |

\* cited by examiner

PIEZOELECTRIC VIBRATING PIECE AND PIEZOELECTRIC DEVICE

CROSS-REFERENCE TO RELATED APPLICATION

This application is a 371 of international application of PCT application serial no. PCT/JP2015/067014, filed on Jun. 12, 2015, which claims the priority benefits of Japan application no. JP 2014-123198, filed on Jun. 16, 2014, and Japan application no. JP 2015-111275, filed on Jun. 1, 2015. The entirety of each of the abovementioned patent applications is hereby incorporated by reference herein and made a part of this specification.

TECHNICAL FIELD

The present invention relates to a piezoelectric vibrating piece and a piezoelectric device.

BACKGROUND ART

An electronic product such as a computer and a mobile terminal includes an electronic device such as a crystal unit, an oscillator, and a resonator. A piezoelectric device includes a piezoelectric vibrating piece vibrating at a predetermined frequency. As such piezoelectric vibrating piece, for example, there has been known a configuration that forms a pair of electrodes on a front surface and a back surface of an SC-cut crystal element (see Patent Document 1). An unwanted response (an A mode and a B mode) is excited at an SC-cut quartz-crystal vibrating piece, in addition to a main vibration (a C mode). To restrain the B mode, which is the unwanted response near the C mode, the main vibration, a filter or a similar member is necessary.

CITATION LIST

Patent Document

Patent Document 1: Japanese Unexamined Patent Application Publication No. 6-85598

SUMMARY

Problems to be Solved

With the above-described SC-cut quartz-crystal vibrating piece, as long as the unwanted response can be restrained only with the vibrating piece, the filter or a similar member is unnecessary. This simplifies a circuit, thereby ensuring improving reliability and reducing the production cost. To restrain the B mode, the unwanted response, a method that excites a quartz-crystal vibrating piece by applying an electric field parallel to the quartz-crystal vibrating piece (parallel electric field excitation) has been proposed. However, the parallel electric field excitation has a problem that, simply disposing electrodes results in a high crystal impedance (CI) compared with the quartz-crystal vibrating piece disclosed in Patent Document 1.

Considering the above-described circumstances, an object of the present invention is to provide the following piezoelectric vibrating piece and a piezoelectric device that includes the piezoelectric vibrating piece. The piezoelectric vibrating piece improves excitation efficiency of a main vibration and reduces CI and restrains an unwanted response compared with the parallel electric field excitation. Thus, the piezoelectric vibrating piece does not require a filter or a similar member to restrain the unwanted response. This ensures simplifying a circuit to improve reliability, allowing a reduction in production cost.

Solutions to the Problems

The present invention provides a piezoelectric vibrating piece that includes a vibrating piece body and at least a pair of excitation electrodes. The vibrating piece body includes a vibrator. The pair of excitation electrodes are formed on respective front surface and back surface of the vibrator. The vibrating piece body is a doubly rotated quartz-crystal vibrating piece cut out parallel to an X"-Z" surface. The X"-Z" surface is rotated around a Z-axis of a crystallographic axis of a crystal and further rotated around an X'-axis. The pair of excitation electrodes are collocated in a Z'''-axis direction determined by an X'''-axis. The X'''-axis is defined by counterclockwise rotation from a +X"-axis direction around a Y"-axis by 260° to 300°. The pair of excitation electrodes are disposed inclined with respect to the Y"-axis direction.

In a case where an interval of the pair of excitation electrodes in the Z'''-axis direction is defined as g and a thickness of the vibrator is defined as t, g/t may be set to 0.183 to 0.366. The pair of excitation electrodes may be disposed so as to partially overlap in the Y"-axis direction. The X'''-axis direction may be configured in a range of 260° to 280° rotation from an X"-axis direction around the Y"-axis. The vibrating piece body may employ an SC cut, an M (Modified)-SC cut, or IT cut. The pair of excitation electrodes may be each formed into a semicircular shape. The pair of excitation electrodes may be disposed such that straight line parts of the excitation electrodes are opposed to or overlap with one another viewed from the Y"-axis direction. The pair of excitation electrodes may be each formed to offset an induced electric charge. The induced electric charge is generated by an unnecessary vibration vibrating at a frequency different from a desired frequency. The pair of excitation electrodes may each include a protrusion. The protrusions overlap in the Y"-axis direction. A piezoelectric device may include the piezoelectric vibrating piece.

TECHNICAL EFFECTS

With the present invention, only with the piezoelectric vibrating piece, excitation efficiency of a main vibration is improved and reduces CI and restrains an unwanted response compared with the parallel electric field excitation. Thus, the piezoelectric vibrating piece does not require a filter or a similar member to restrain the unwanted response. This ensures simplifying a circuit to improve reliability, allowing a reduction in production cost.

BRIEF DESCRIPTION OF THE DRAWINGS

FIG. 1A is the plan view, FIG. 1B is a cross-sectional view taken along a line J-J in FIG. 1A, FIG. 1C is a diagram illustrating a coordinate system, and FIG. 1D is a cross-sectional view of a main part.

FIG. 2A is a graph illustrating C1, FIG. 2B is a graph illustrating a part of FIG. 2A, and FIG. 2C is a graph illustrating CI.

FIG. 3A is a graph illustrating C1, FIG. 3B is a graph illustrating a part of FIG. 3A, and FIG. 3C is a graph illustrating CI.

FIG. 5A is a graph in C mode, and 5B is a graph in B mode.

FIG. 6A is a graph of fundamental wave, and FIG. 6B is a graph of fifth harmonic.

FIG. 13A is a graph in C mode, and FIG. 13B is a graph in B mode.

FIG. 21A is the plan view, FIG. 21B is a cross-sectional view taken along a line K-K in FIG. 21A, and FIG. 21C is a plan view of main parts.

FIG. 22D is a graph illustrating C1, and FIG. 22E is a graph illustrating CI.

FIG. 23A is the plan view, FIG. 23B is a plan view of main parts in FIG. 23A, FIG. 23C is a graph illustrating C1 in the case where the angle ψ is changed, and FIG. 23D is a graph illustrating C1 in the case where the angle ψ is changed.

FIG. 24A is the plan view, FIG. 24B is a plan view of main parts in FIG. 24A, FIG. 24C is a graph illustrating C1 in the case where the angle ψ is changed, and FIG. 24D is a graph illustrating C1 in the case where the angle ψ is changed.

DESCRIPTION OF EMBODIMENTS

Hereinafter, a description will be given of embodiments of the present invention with the reference to the accompanying drawings. However, the present invention is not limited to this. In order to describe the following embodiments, the drawings are expressed by changing the scale as necessary. For example, the illustration is partially enlarged or emphasized.

First Embodiment

Figure 1A:
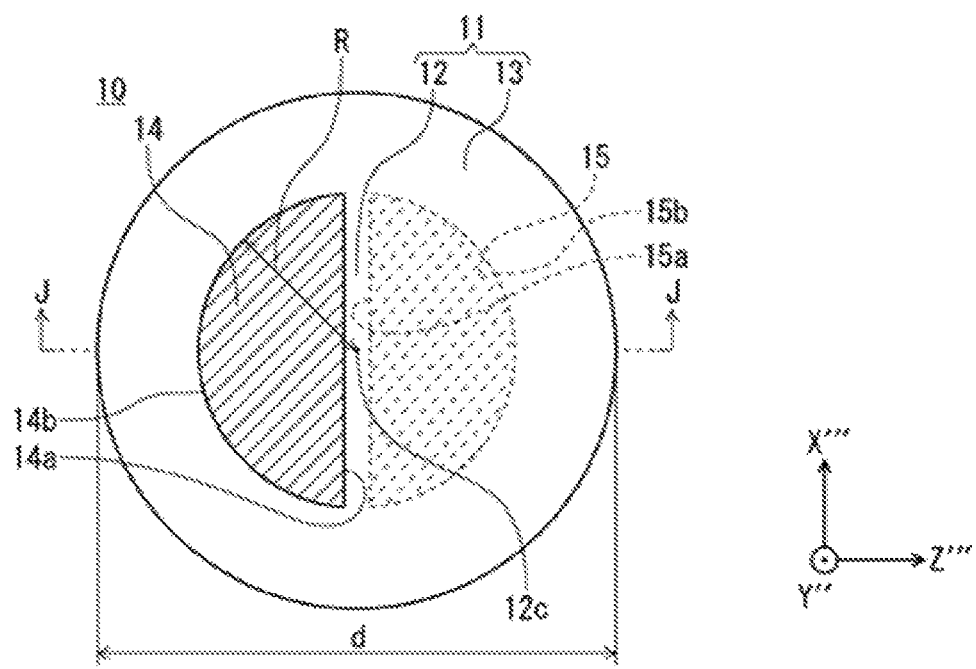
FIGS. 1A-1D illustrate an example of a piezoelectric vibrating piece according to a first embodiment.
Figure 1B:
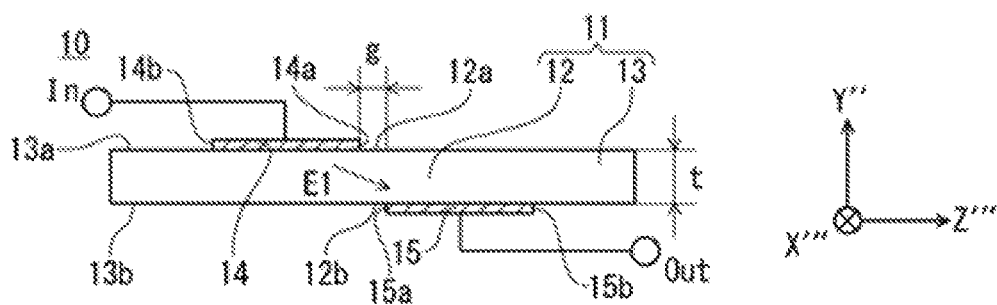

The following describes a piezoelectric vibrating piece according to the first embodiment with reference to the drawings. FIGS. 1A-1D illustrate an example of a piezoelectric vibrating piece according to the first embodiment, FIG. 1A is the plan view, and FIG. 1B is a cross-sectional view taken along a line J-J in FIG. 1A. FIG. 1A and FIG. 1B use an X''', Y''', and Z''' coordinate system to describe directions in the drawings. This coordinate system will be described later.

As illustrated in FIG. 1A and FIG. 1B, a piezoelectric vibrating piece 10 includes a vibrating piece body 11 and a pair of excitation electrodes 14 and 15. The vibrating piece body 11 employs an SC-cut, which is a doubly rotated quartz-crystal vibrating piece cut out from a quartz crystal.

Figure 1C:
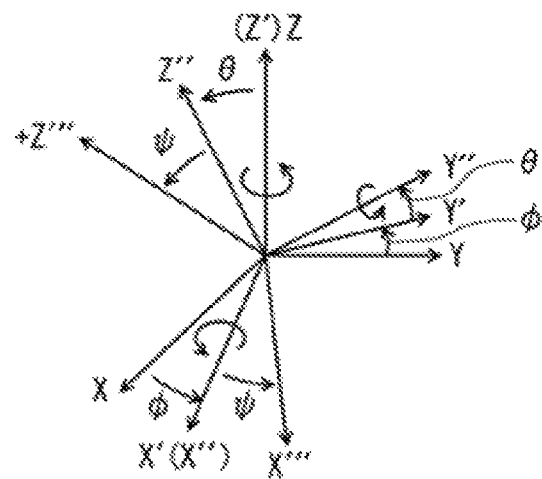

Respective axes in the XYZ coordinate system illustrated in FIG. 1C indicates an electrical axis (an X-axis), a mechanical axis (a Y-axis), and an optical axis (a Z-axis) each of which are crystallographic axes of the crystal. As illustrated in FIG. 1C, first, the vibrating piece body 11 is cut out parallel to an X''-Z'' surface, which is formed through rotation by an angle φ around the Z-axis and further a rotation by an angle θ around the X'-axis. The angle φ is set to 22.5°, and the angle θ is set to 34°. The X'''-Y'''-Z''' coordinate system in FIG. 1A and FIG. 1B is set by a counterclockwise rotation in the X''-Y''-Z'' coordinate system around the Y''-axis in the +X''-axis direction by the angle ψ. As for the respective X''-direction, X'''-direction, Y"-direction, Z"-direction, and Z'"-direction, the arrow directions in the drawing are +direction while directions opposite from the arrow directions are −direction. Other embodiments also use the above-described coordinate system.

Such SC-cut quartz-crystal vibrating piece has a temperature characteristic drawing a cubic curve and is used for a vibrating piece for a crystal controlled oscillator with oven or a similar vibrating piece. The SC-cut quartz-crystal vibrating piece generates a main vibration referred to as a C mode. In a high frequency region in C mode, the SC-cut quartz-crystal vibrating piece generates an unwanted response referred to as an A mode and a B mode. The B mode is present in a frequency region around 10% higher than the C mode. Therefore, in the case where a preferred frequency is desired to be obtained in C mode, this property possibly generates the B mode. A crystal impedance (CI) in A mode is larger than CI in C mode, and the A mode-frequency is around 1.88 times of the C mode-frequency, sufficiently away from the C mode-frequency; therefore, the A mode does not especially cause a problem in this embodiment.

The vibrating piece body 11 is formed into a disk shape. The vibrating piece body 11 is formed so as to have a planar direction in the X'"-Z'"-direction. The vibrating piece body 11 has a thickness direction in the Y"-axis direction. This vibrating piece body 11 includes a vibrator 12 and a peripheral portion 13.

The vibrator 12 is a part to generate vibrations at a predetermined frequency. The vibrator 12 is formed into a disk shape including a center part of the vibrating piece body 11 viewed from the Y"-axis direction. This vibrator 12 has a thickness t in the Y"-axis direction. The peripheral portion 13 is formed surrounding the vibrator 12 viewed from the Y"-axis direction. The peripheral portion 13 is, for example, a part held with a supporter or a similar member when housed in, for example, a package. A front surface (a +Y"-side surface) 12a of the vibrator 12 is formed on a surface identical to a front surface (the +Y"-side surface) 13a of the peripheral portion 13. A back surface (a −Y"-side surface) 12b of the vibrator 12 is formed on a surface identical to a back surface (the −Y"-side surface) 13b of the peripheral portion 13.

The excitation electrode 14 forms a pair of electrodes together with the excitation electrode 15. The excitation electrode 14 is formed on the front surface 12a of the vibrator 12. The excitation electrode 15 is formed on the back surface 12b of the vibrator 12. The excitation electrode 15 is disposed symmetrically to the excitation electrode 14 with respect to a straight line parallel to the X'"-axis direction and passing through a center of a thickness at a center 12c of the vibrating piece body 11 viewed from the Y"-axis direction. Accordingly, the following omits an explanation on configurations of the excitation electrode 15 similar to those of the excitation electrode 14.

As illustrated in FIG. 1A, the pair of excitation electrodes 14 and 15 are collocated in the Z'"-axis direction determined by the X'"-axis direction, which is defined by counterclockwise rotation from the +X"-axis direction around the Y"-axis by the angle ψ. As illustrated in FIG. 1B, the excitation electrodes 14 and 15 are disposed in a direction inclined with respect to the Y"-axis direction. When the excitation electrodes 14 and 15 apply an electric field E1 on the vibrator 12 in the direction inclined with respect to the Y"-axis direction, the vibrator 12 vibrates at a predetermined frequency. The direction of the electric field E1 illustrated in FIG. 1B shows a case where the excitation electrode 14 is configured as an input side and the excitation electrode 15 is configured as an output side.

Figure 1D:
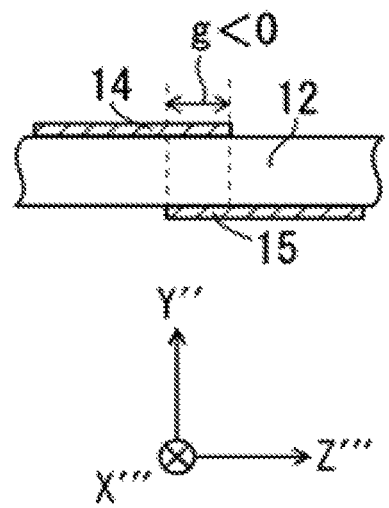

The excitation electrode 14 is formed at a region on the −Z'"-side of the front surface 12a of the vibrator 12. The excitation electrode 14 is formed into a semicircular shape viewed from the Y"-axis direction. An end portion on the +Z'"-side of the excitation electrode 14 forms a straight line part 14a parallel to the X'"-axis direction. The excitation electrode 14 has an arc part 14b connecting both end portions of the straight line part 14a. A distance from the center 12c to the arc part 14b viewed from the Y"-axis direction is set to R. An interval between the excitation electrode 14 and the excitation electrode 15 in the Z'"-axis direction is set to g. That is, an interval between the straight line part 14a and a straight line part 15a on the excitation electrode 15 in the Z'"-axis direction becomes g. The following describes sings for a value of the interval g. The value of the interval g with the excitation electrode 14 and the excitation electrode 15 disposed so as not to overlap with one another viewed from the Y"-axis direction (see FIG. 1A and FIG. 1B) is defined as '+(positive).' Meanwhile, as illustrated in FIG. 1D, the value of the interval g with the excitation electrode 14 and the excitation electrode 15 disposed so as to overlap with one another viewed from the Y"-axis direction is defined as '−(negative).' The value of the interval g with the excitation electrode 14 and the excitation electrode 15 disposed such that the straight line parts 14a and 15a overlap with one another viewed from Y"-axis direction is defined as '0.' The following omits the description of the sign '+' in the case of the value of the interval g being '+.'

The excitation electrodes 14 and 15 are made from a conductive metal film. As the metal film, for example, a laminated structure constituted of, for example, two layers or three layers where chrome (Cr), titanium (Ti), and nickel (Ni), or nickel chrome (NiCr), nickel titanium (NiTi), and nickel tungsten (NiW) alloy is formed as a base layer having a role of improving an adhesion of the respective electrodes to a quartz-crystal material and gold (Au) and argentum (Ag) are formed on the alloy is employed. The excitation electrode 24 and a similar electrode according to the following embodiments are also metal films with similar constitution.

Figure 2A:
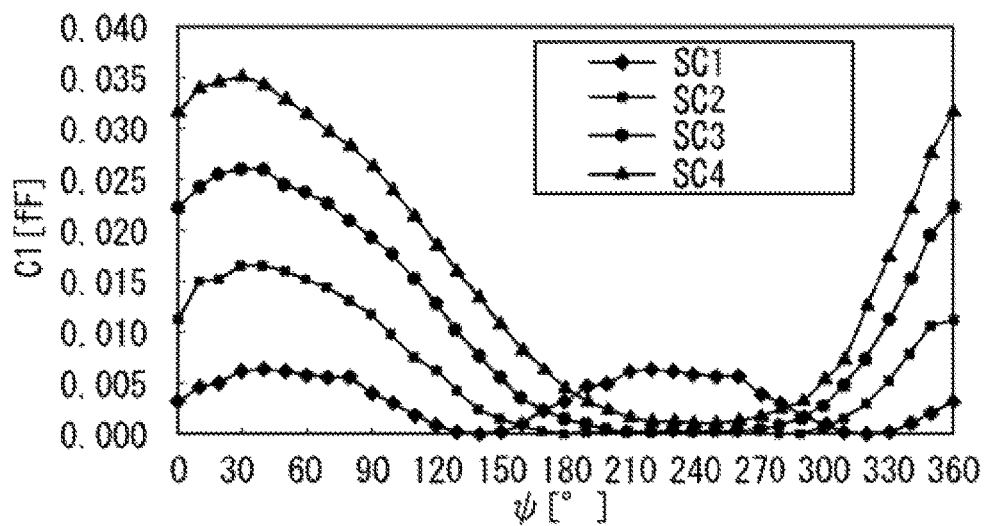
FIGS. 2A-2C illustrate a vibration characteristic of a B mode at the piezoelectric vibrating piece in FIGS. 1A-1D in the case where an angle ψ is changed.
Figure 2B:
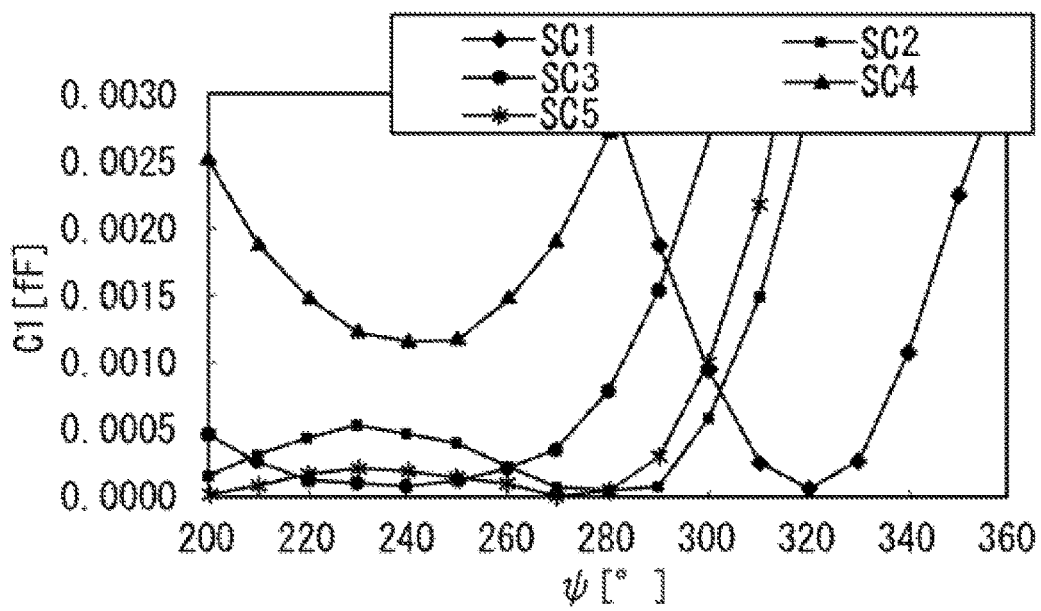
Figure 2C:
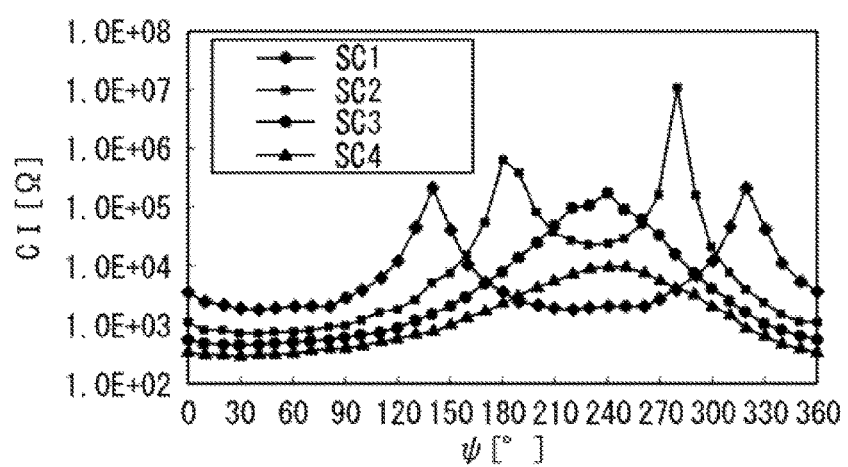

FIGS. 2A-2C are graphs illustrating a vibration characteristic in B mode in the case where the angle ψ is changed in the piezoelectric vibrating piece 10 configured as described above. In FIG. 2A and FIG. 2B, the vertical axis indicates C1 (equivalent series capacitance) (unit: fF) and the horizontal axis indicates the angle ψ (unit: °). Although FIG. 2B is a graph similar to FIG. 2A, FIG. 2B illustrates the graph with the angle ψ indicated in the horizontal axis of 200° to 360°. In FIG. 2C, the vertical axis indicates CI (unit: Ω) and the horizontal axis indicates the angle ψ (unit: °).

Figure 3A:
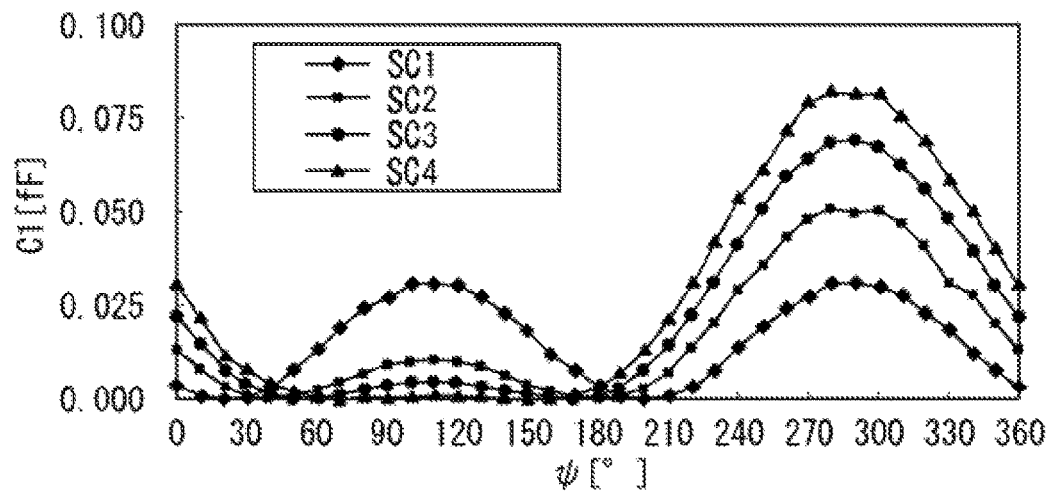
FIGS. 3A-3C illustrate a vibration characteristic of a C mode at the piezoelectric vibrating piece in FIGS. 1A-1D in the case where the angle ψ is changed.
Figure 3B:
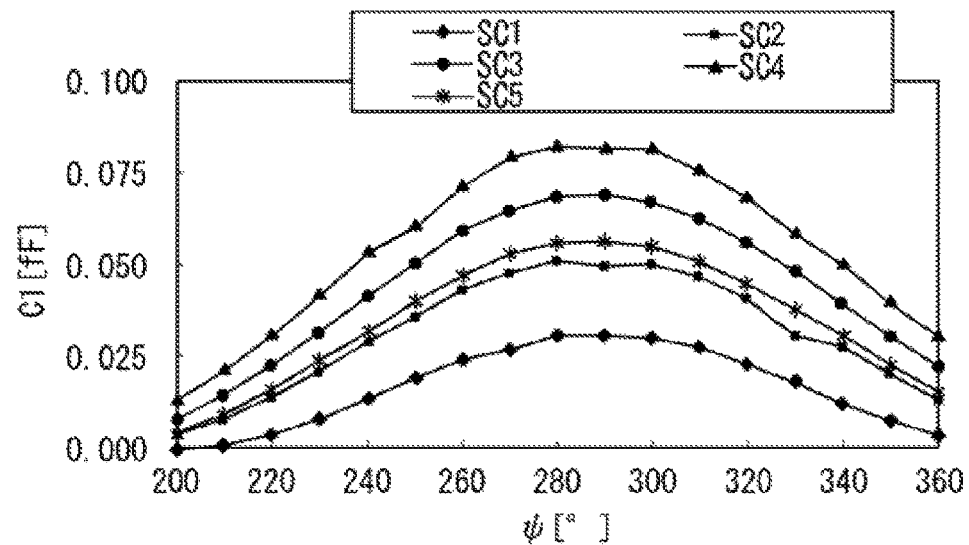
Figure 3C:
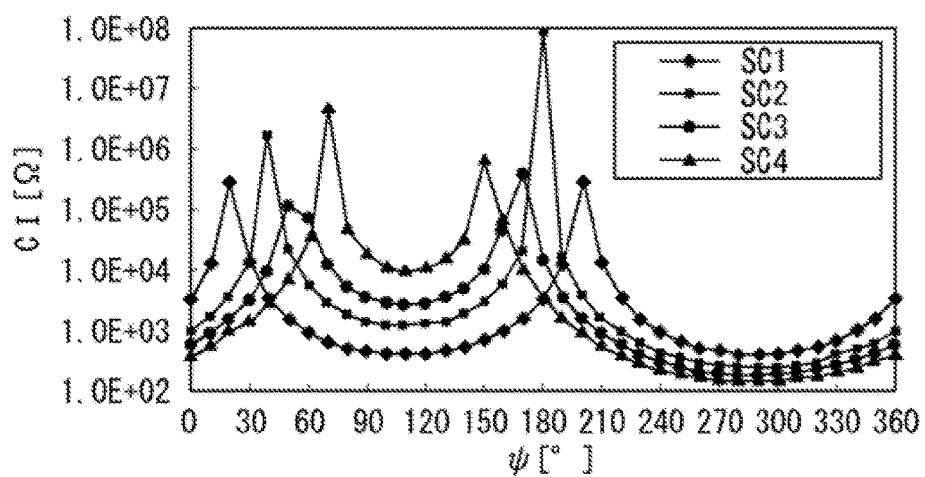

FIGS. 3A-3C are graphs illustrating the vibration characteristic in C mode in the case where the angle ψ is changed in the piezoelectric vibrating piece 10 configured as described above. In FIG. 3A and FIG. 3B, the vertical axis indicates C1 (unit: fF) and the horizontal axis indicates the angle ψ (unit: °). Although FIG. 3B is a graph similar to FIG. 3A, FIG. 3B illustrates the graph with the angle ψ indicated in the horizontal axis of 200° to 360°. In FIG. 3C, the vertical axis indicates CI (unit: Ω) and the horizontal axis indicates the angle ψ (unit: °). FIGS. 2A-2C and FIGS. 3A-3C illustrate the case of third harmonic. The vibrating piece body 11 employs a convex-shaped circular plate on one surface configured to have the thickness t of 546 (μm), a diameter d of 8 (mm), and a curvature radius of 240 (mm).

FIGS. 5A-5B, FIGS. 7A-7B to FIGS. 10A-10B, and FIG. 12B, which will be described later, use the vibrating piece body 11 with the above-described configuration and illustrate the case of the third harmonic.

SC2, SC3, SC4, and SC5 in FIGS. 2A-2C and FIGS. 3A-3C are the piezoelectric vibrating piece 10 where respective g/t values (a value found by dividing the interval g into the thickness t) are set to predetermined values. The g/t value is each set to '0.366' in SC2, '0' in SC3, '−0.366' in SC4, and '0.183' in SC5. The intervals g in SC2, SC3, SC4, and SC5 are around 200 (μm), 0 (μm), −200 (μm), and 100 (μm).

With the '+(positive)' g/t value (SC2 and SC5), the straight line parts 14a and 15a of the excitation electrode 14 and the excitation electrode 15 are opposed to one another viewed from the Y"-axis direction and the excitation electrode 14 and the excitation electrode 15 do not overlap. With the g/t value of '0' (SC3), the straight line parts 14a and 15a of the excitation electrode 14 and the excitation electrode 15 overlap with one another viewed from the Y"-axis direction. With the '−(negative)' g/t value (SC4), the straight line parts 14a and 15a of the excitation electrode 14 and the excitation electrode 15 are opposed to one another viewed from the Y"-axis direction and the excitation electrode 14 and the excitation electrode 15 partially overlap with one another.

Figure 4:
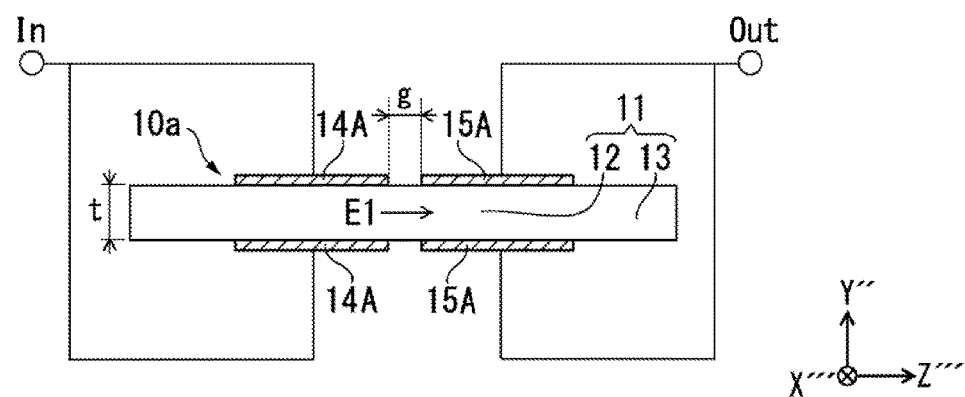
FIG. 4 is a cross-sectional view illustrating a piezoelectric vibrating piece according to a comparative example.

SC1 in FIGS. 2A-2C and FIGS. 3A-3C is comparative examples. FIG. 4 is a cross-sectional view illustrating a piezoelectric vibrating piece 10a of SC1. As illustrated in FIG. 4, the piezoelectric vibrating piece 10a of SC1 includes excitation electrodes 14A and 14A and excitation electrodes 15A and 15A, which are formed sandwiching the vibrating piece body 11, that provide the interval g in the Z'''-axis direction. The g/t value of the piezoelectric vibrating piece 10a is set to '0.366' and the interval g is around 200 (μm). The vibrator 12 of the piezoelectric vibrating piece 10a generates the electric field E1 in the Z'''-axis direction. The excitation caused by the electric field E1 illustrated in FIG. 4 is a parallel electric field excitation. The direction of the electric field E1 illustrated in FIG. 4 is the case where the excitation electrodes 14A are configured as the input side and the excitation electrodes 15A are configured as the output side.

As illustrated in FIG. 2A, it is confirmed that C1 at SC2, SC3, SC4, and SC5 in B mode in the case where the angle ψ is changed from 0° to 360° becomes the minimum value at the angle ψ close to 2100 to 2700. As illustrated in FIG. 3A, it is confirmed that C1 at SC2, SC3, SC4, and SC5 in C mode in the case where the angle ψ is changed from 0° to 360° becomes the maximum value at the angle ψ close to 270° to 300°.

In the case where the angle ψ is set larger than 210° and smaller than 260°, C1 in B mode becomes the minimum value; however, C1 in C mode significantly out of the maximum value. On the other hand, in the case where the angle ψ is set larger than 280° and smaller than 300°, C1 in C mode becomes the maximum value; however, C1 in B mode significantly out of the minimum value. However, as illustrated in FIG. 3B, with the angle ψ set to 260° to 280°, C1 in C mode at SC2, SC3, SC4, and SC5 become the maximum value or a value close to the maximum value and as illustrated in FIG. 2B, C1 in B mode becomes the minimum value or a value close to the minimum value. Accordingly, with the angle ψ set to 260° to 280°, C1 in C mode is sufficiently secured and C1 in B mode is reduced.

With the angle ψ exceeding 280° but set to 300° or less, that is, even with the angle ψ of 280° to 300°, C1 in C mode is sufficiently higher than C1 in B mode. In this case, as illustrated in FIG. 2C and FIG. 3C, CI in B mode becomes a value approximately ten times or more of CI in C mode; therefore, the excitation in B mode is restrained compared with the excitation in C mode.

C1 in C mode at SC2, SC3, SC4, and SC5 in the case where the angle ψ is set to 260° to 300° and the B mode is restrained is higher than C1 in C mode at SC1 when the B mode is restrained. That is, as illustrated in FIG. 2A, with the angle ψ of 140° and 320°, C1 in B mode at SC1 becomes the minimum value and the B mode is restrained; however, as illustrated in FIG. 3A, C1 in C mode in this case is around 0.025 (fF). On the other hand, C1 at SC2, SC3, SC4, and SC5 in C mode in the case where the angle ψ is set to 260° to 300° and the B mode is restrained becomes the minimum in SC2, 0.050 (fF), which is twice of SC1. Thus, restraining the B mode by the configurations of SC2 to SC5 ensures obtaining the C mode with C1 higher than SC1.

As illustrated in FIG. 2B, SC2 and SC5, which are disposed such that the straight line parts 14a and 15a are opposed to one another and the excitation electrodes 14 and 15 do not overlap viewed from the Y"-axis direction, with the angle ψ set to 260° to 280° have C1 in B mode with a value near '0.' Also in the case of the g/t value set to larger than 0.183 and smaller than 0.366, C1 in B mode similarly becomes the value near '0.' Therefore, with the piezoelectric vibrating piece 10 with the angle ψ set to 260° to 280°, setting the g/t value to 0.183 to 0.366 ensures almost fully restraining the B mode.

Although the above-described configuration almost fully suppresses C1 in B mode, as illustrated in FIG. 3B, the excitation in C mode is weaker than a vertical excitation, which is usually used. Therefore, to improve excitation efficiency in C mode, for example, like SC4 and SC6 and SC7, which will be described later, a configuration that disposes the pair of excitation electrodes so as to partially overlap viewed from the Y"-axis direction is preferably employed. Accordingly, the g/t value is set appropriately according to oscillation strength of the desired C mode. Note that, in this case, the B mode is not fully restrained.

Figure 5A:
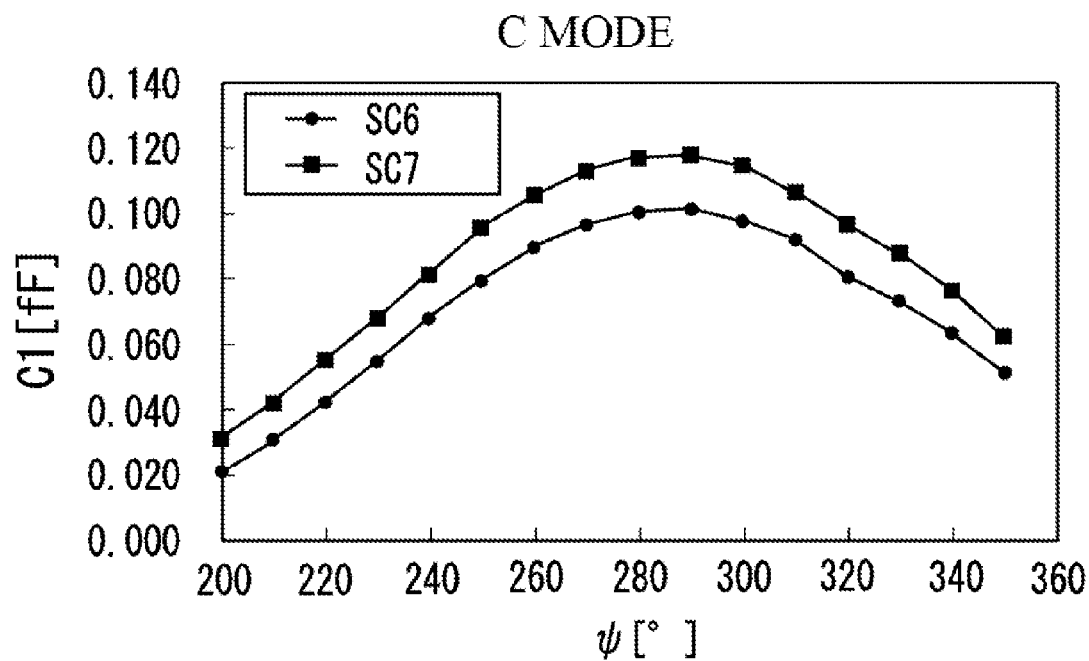
FIGS. 5A-5B illustrate C1 at the piezoelectric vibrating piece in FIGS. 1A-1D in the case where the angle ψ is changed.
Figure 5B:
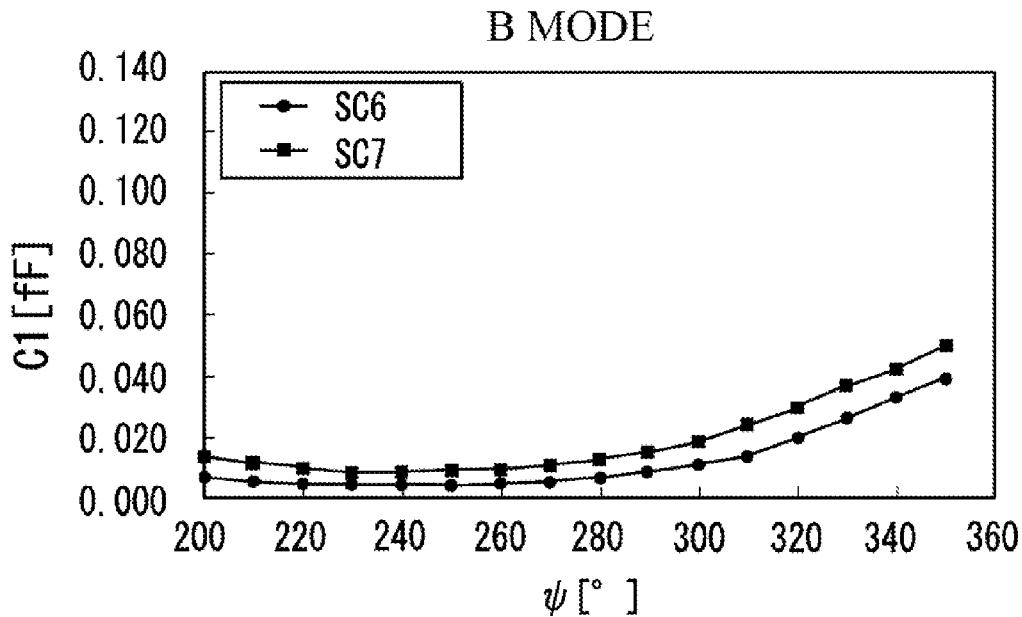

FIG. 5A is a graph illustrating C1 in C mode in the case where the angle ψ is changed from 200° to 360° in the piezoelectric vibrating piece 10 configured as described above. In FIG. 5A, the vertical axis indicates C1 (unit: fF) and the horizontal axis indicates the angle ψ (unit: °). FIG. 5B is a graph illustrating a vibration characteristic in B mode in the case where the angle ψ is changed from 200° to 360° in the piezoelectric vibrating piece 10 configured as described above. In FIG. 5B, the vertical axis indicates C1 (unit: fF) and the horizontal axis indicates the angle ψ (unit: °). The intervals g of SC6 and SC7 in FIG. 5A and FIG. 5B are set to −400 (μm) and −600 (μm), respectively.

As illustrated in FIG. 5A, it is confirmed that C1 of SC6 and SC7 in C mode in the case where the angle ψ is changed becomes the maximum value at the angle ψ close to 270° to 300° similar to the above-described SC2 to SC5. As illustrated in FIG. 5B, C1 of SC6 and SC7 in B mode in the case where the angle ψ is changed becomes the minimum value as it is confirmed that the C1 becomes the minimum value at the angle ψ close to 210° to 270° similar to the above-described SC2 to SC5; however, the B mode is not fully restrained.

As illustrated in FIGS. 2A-2C, FIGS. 3A-3C, and FIGS. 5A-5B, in comparison of SC4, SC6, and SC7 whose interval g is '−(negative)' with SC2, SC3, and SC5 whose interval g is '+(positive)' or '0,' although C1 in B mode is slightly larger, C1 in C mode becomes large. It can be said that the excitation is more likely to be generated in the C mode compared with the B mode. That is, the configuration where the pair of excitation electrodes 14 and 15 are disposed so as to partially overlap with one another in the Y"-axis direction (see FIG. 1D) can sufficiently secure the excitation in C mode while reducing the B mode compared with the configuration where the excitation electrode 14 and the excitation electrode 15 are disposed so as not to overlap with one another.

The following describes a method for fabricating the piezoelectric vibrating piece 10. For example, the piezoelectric vibrating piece 10 is formed of a crystal bar cut out by SC-cut from a blank of synthetic quartz crystal. The thickness t of the vibrator 12 is adjusted so as to vibrate at a predetermined vibration frequency. The excitation electrodes 14 and 15 are each formed on both surfaces of the piezoelectric vibrating piece 10 by forming predetermined metal films by, for example, sputter deposition or vacuum evaporation via a metal mask. As the method for forming the metal films, methods such as photolithography and etching, a printing method such as screen-printing, and plating may be used. A change in vibration characteristic from a design value in the case where the angle ψ or the interval g differs from the design value in the piezoelectric vibrating piece 10 is comparatively gradual. This makes it possible to provide a sufficient margin in dimensional tolerance of the excitation electrodes 14 and 15. Accordingly, the fabrication of the piezoelectric vibrating pieces 10 set to the desired dimensions is comparatively easy. A method for fabricating the piezoelectric vibrating piece according to the following embodiments is also similar to the above-described method.

As described above, setting the angle ψ to 260° to 300° in the piezoelectric vibrating piece 10 ensures effectively restraining the B mode while sufficiently securing the excitation in C mode. With the interval g set to '−(negative),' the excitation in C mode can be sufficiently secured. Accordingly, the use of such piezoelectric vibrating piece 10 for the piezoelectric device eliminates the need for the filter or a similar member to restrain the B mode for the piezoelectric device. Accordingly, simplifying a circuit of the piezoelectric device allows improving the reliability and reducing the production cost.

Figure 6A:
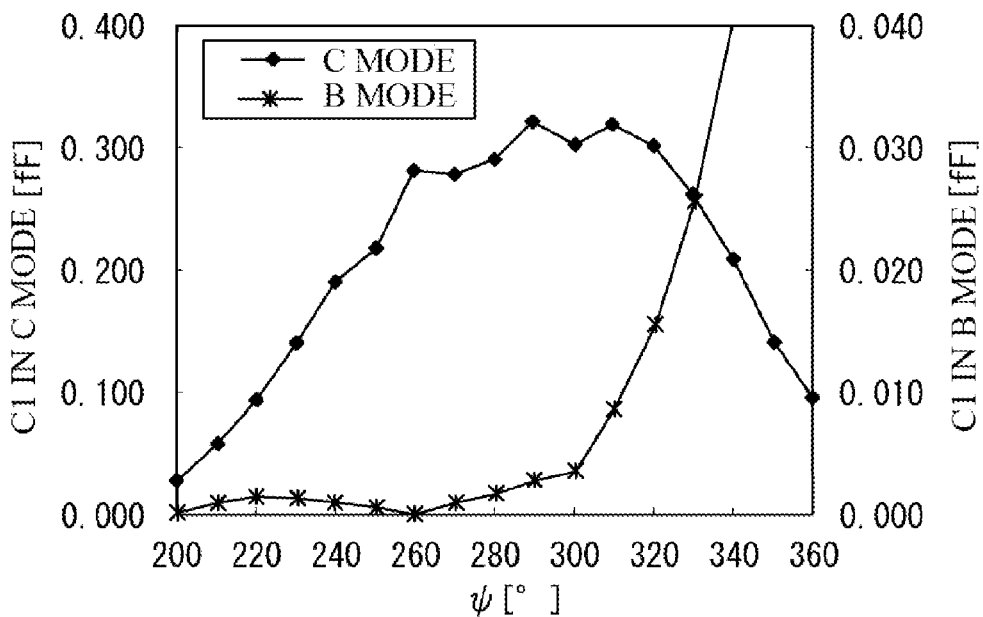
FIGS. 6A-6B illustrate C1 in B mode and the C mode at the piezoelectric vibrating piece in FIGS. 1A-1D in the case where the angle ψ is changed.
Figure 6B:
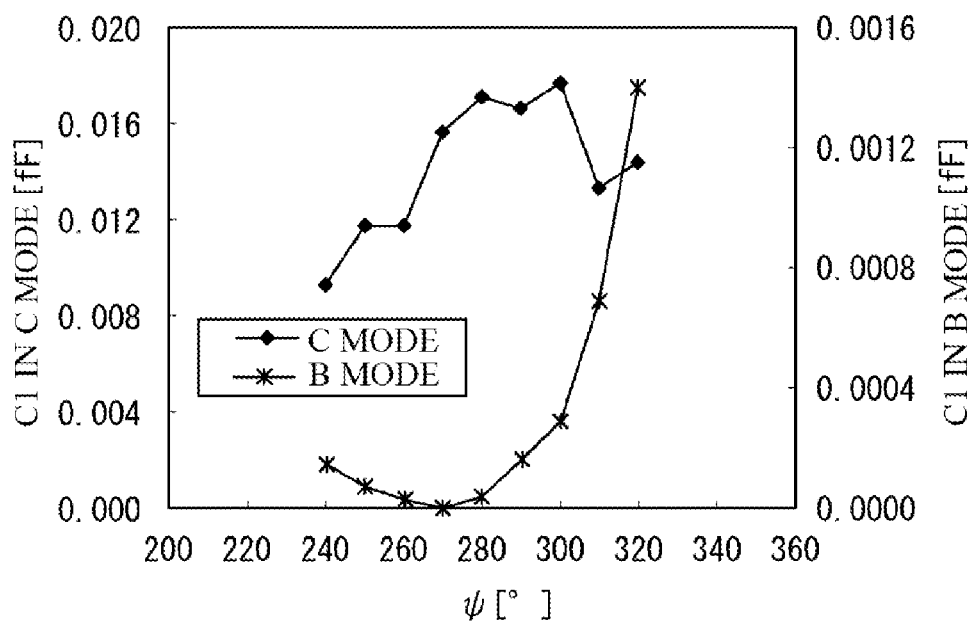

FIGS. 6A-6B illustrate C1 in B mode and C mode at the piezoelectric vibrating piece 10 in the case where the angle ψ is changed. FIG. 6A is a graph of fundamental wave, and FIG. 6B is a graph of fifth harmonic. In FIG. 6A and FIG. 6B, the vertical axis indicates C1 (unit: fF) and the horizontal axis indicates the angle ψ (unit: °). As the piezoelectric vibrating piece 10, the above-described SC5 (g/t=0.183) is employed. As illustrated in FIG. 6A and FIG. 6B, in the case of fundamental wave and fifth harmonic as well, similar to the above-described third harmonic, it is confirmed that C1 in C mode becomes the maximum value or a value close to the maximum value at the angle ψ close to 260° to 280° and C1 in B mode becomes a value close to 0. Accordingly, with the angle ψ set to 260° to 280°, regardless of higher harmonic order, the C mode is strongly excited while the B mode is restrained, thereby ensuring obtaining the effect similar to the above-described effect in the case of third harmonic.

The piezoelectric vibrating piece 10 according to the first embodiment is described above. Note that, the angle φ and the angle θ may be set to angles other than the above-described angles. Instead of the vibrating piece body 11 with the circular shape viewed from the Y"-axis direction, the vibrating piece body 11 may have a rectangular shape, an oval shape, an elliptical shape, a multangular shape other than a quadrangular shape, and a similar shape. The vibrating piece body 11 is not limited to one having one surface with convex shape. For example, both surfaces of the vibrating piece body 11 may have the convex shape or both surfaces may have a planar shape. Alternatively, one surface or both surfaces may form a mesa. The vibrator 12 may include a mesa with the thickness t in the Y"-axis direction is formed thicker than the peripheral portion 13. Instead of the excitation electrodes 14 and 15 with the semicircular shape, the excitation electrodes 14 and 15 may have a rectangular shape, an oval shape, an elliptical shape, a multangular shape other than a quadrangular shape, and a similar shape. The shapes or the sizes of the excitation electrodes 14 and 15 may differ from one another. Plural pairs of the excitation electrodes 14 and 15 may be disposed at the vibrator 12. Matters on the above-described piezoelectric vibrating piece 10 are similarly applicable to embodiments described later.

<Modifications>

The following describes a first modification and a second modification of the first embodiment. Piezoelectric vibrating pieces according to the first and the second modifications have a configuration similar to the piezoelectric vibrating piece 10 except for a configuration of a crystal forming a vibrating piece body.

Figure 7A:
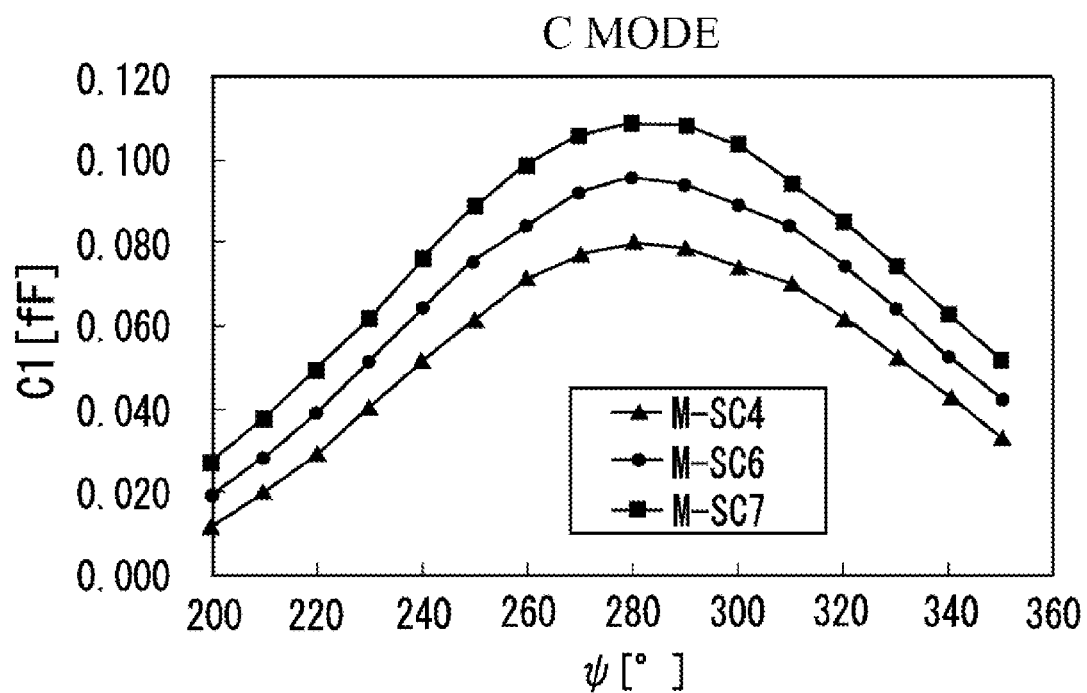
FIGS. 7A-7B are graphs illustrating C1 in C mode according to a first modification in the case where the angle ψ is changed.
Figure 7B:
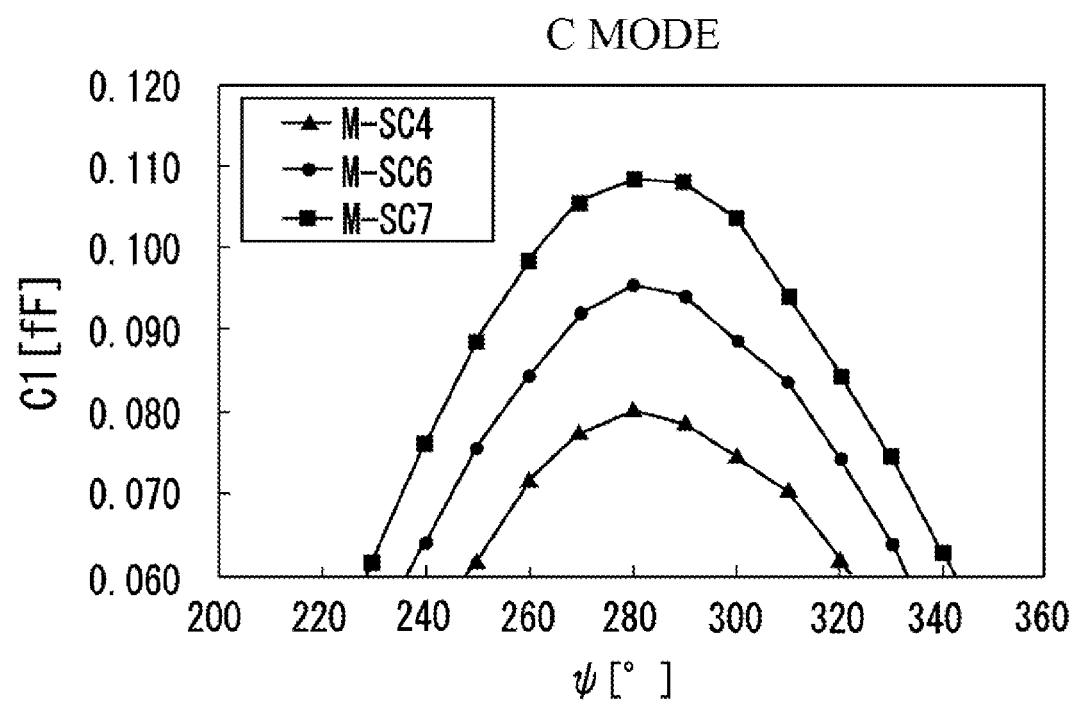
Figure 8A:
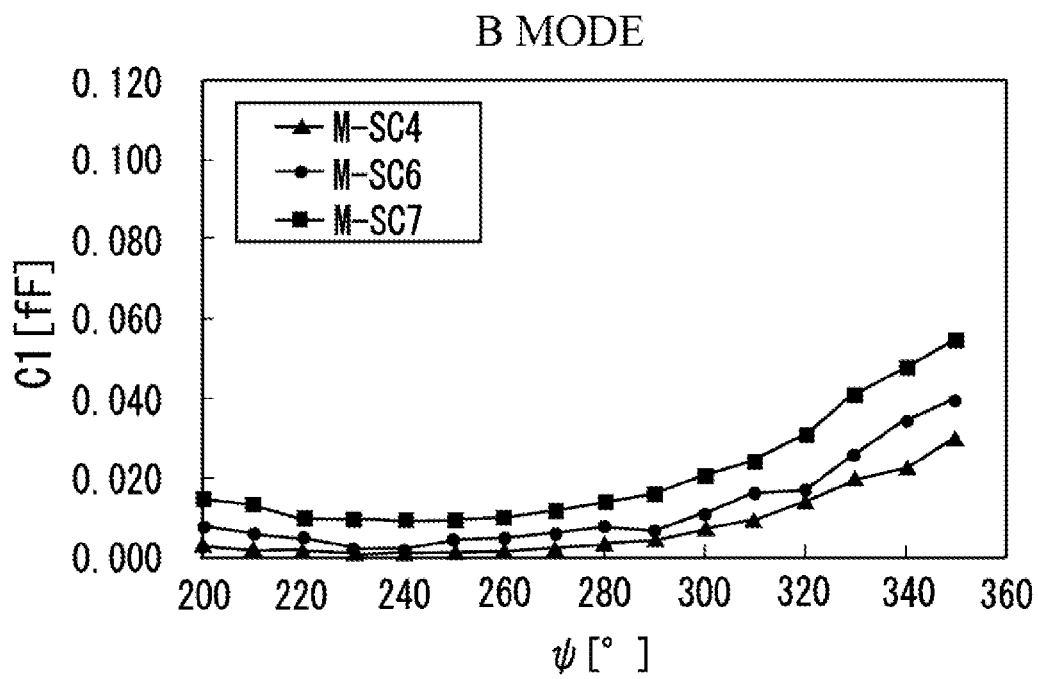
FIGS. 8A-8B are graphs illustrating C1 in B mode according to the first modification in the case where the angle ψ is changed.
Figure 8B:
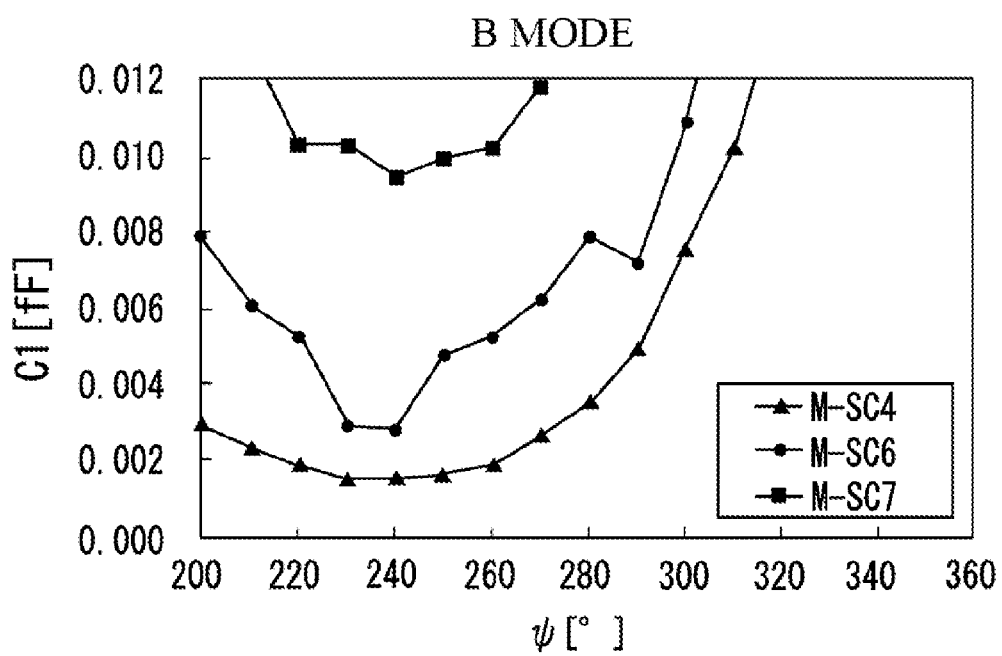

The vibrating piece body of the first modification is M-SC cut, and the angle θ is set to 33.89° and the angle φ is set to 24.250. FIGS. 7A-7B are graphs illustrating C1 in C mode at M-SC4, M-SC6, and M-SC7 in the case where the angle ψ is changed at the piezoelectric vibrating piece according to the first modification. FIGS. 8A-8B are graphs illustrating C1 in B mode at M-SC4, M-SC6, and M-SC7 in the case where the angle ψ is changed at the piezoelectric vibrating piece according to the first modification. In FIGS. 7A-7B and FIGS. 8A-8B, the vertical axis indicates C1 (unit: fF) and the horizontal axis indicates the angle ψ (unit: °). FIG. 7B and FIG. 8B are enlarged figures of FIG. 7A and FIG. 8A. M-SC4, M-SC6, and M-SC7 have the intervals g different from one another. The intervals g of M-SC4, M-SC6, and M-SC7 are set to −200 (μm), −400 (μm), and −600 (μm), respectively.

As illustrated in FIGS. 7A-7B, it is confirmed that C1 in C mode at M-SC4, M-SC6, and M-SC7 in the case where the angle ψ is changed all becomes the maximum value at the angle ψ close to 280°. As illustrated in FIGS. 8A-8B, it is confirmed that C1 in B mode at M-SC4, M-SC6, and M-SC7 in the case where the angle ψ is changed becomes the minimum value at the angle ψ close to 220° to 250°.

Figure 9A:
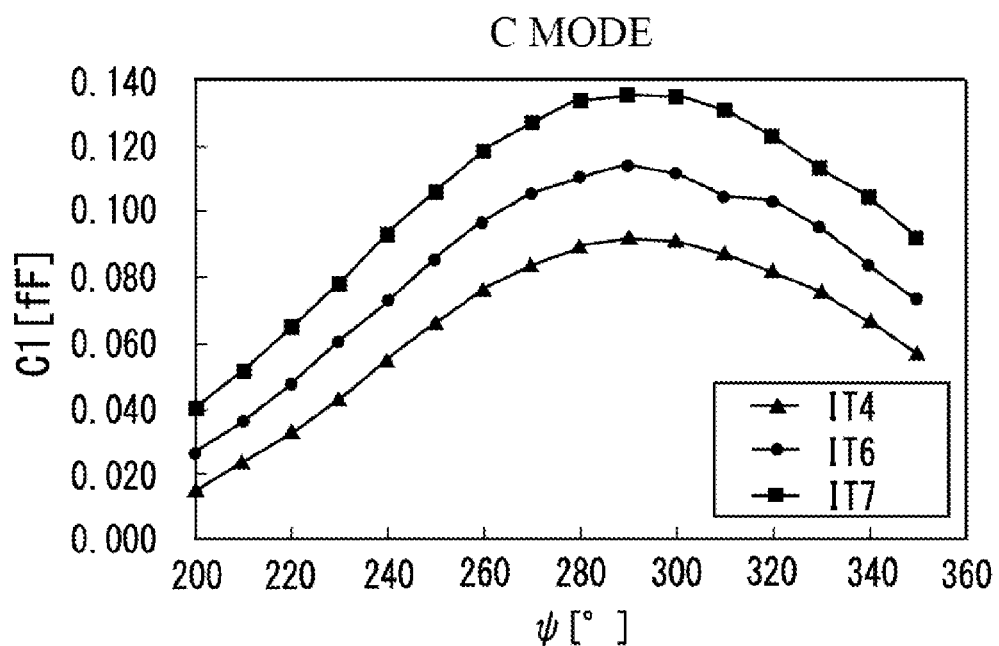
FIGS. 9A-9B are graphs illustrating C1 in C mode according to a second modification in the case where the angle ψ is changed.
Figure 9B:
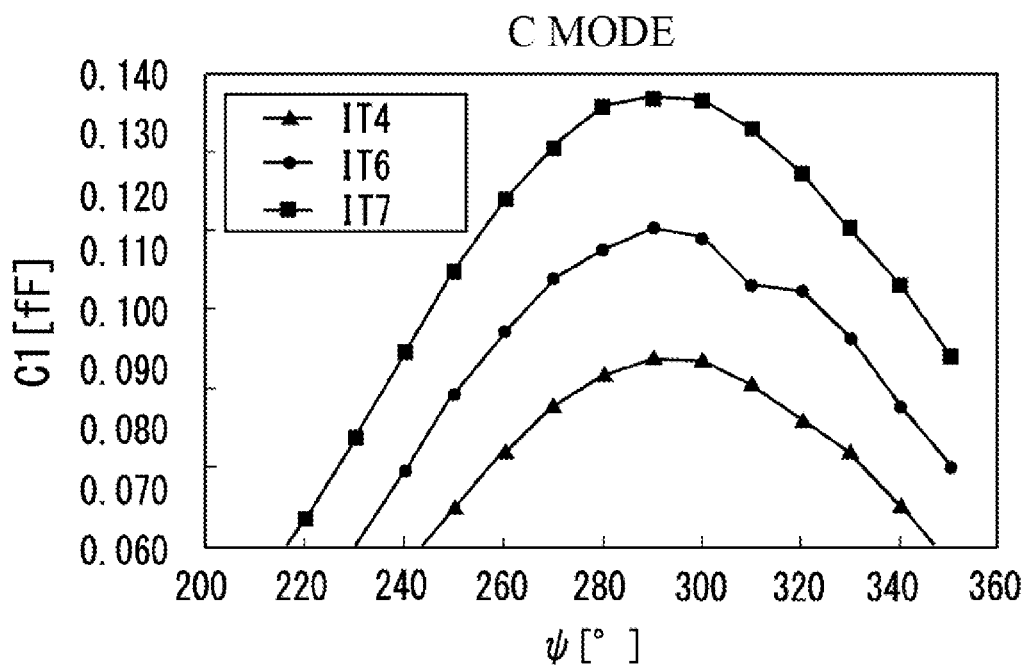
Figure 10A:
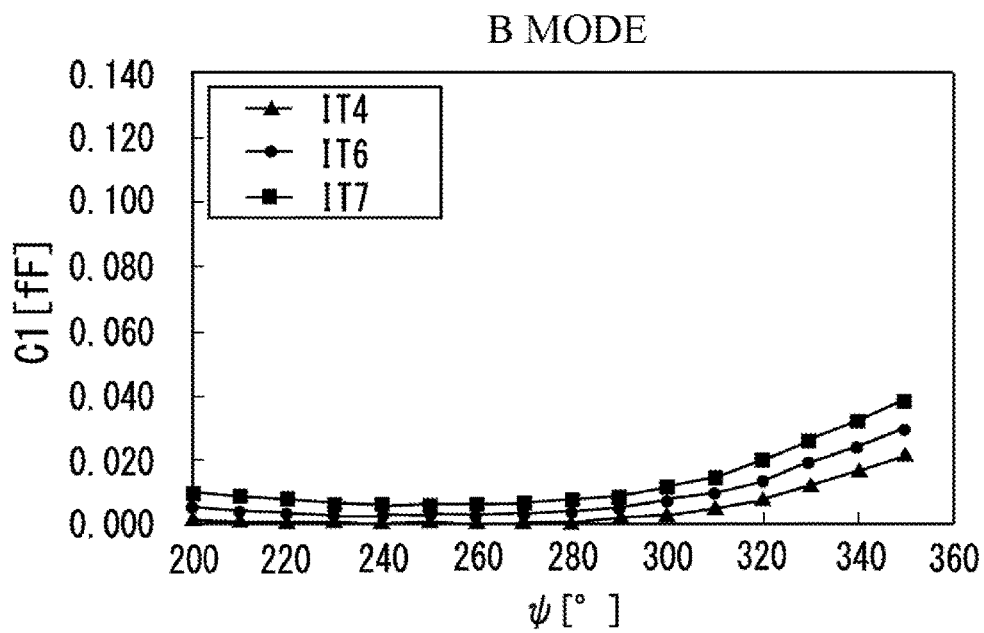
FIGS. 10A-10B are graphs illustrating C1 in B mode according to the second modification in the case where the angle ψ is changed.
Figure 10B:
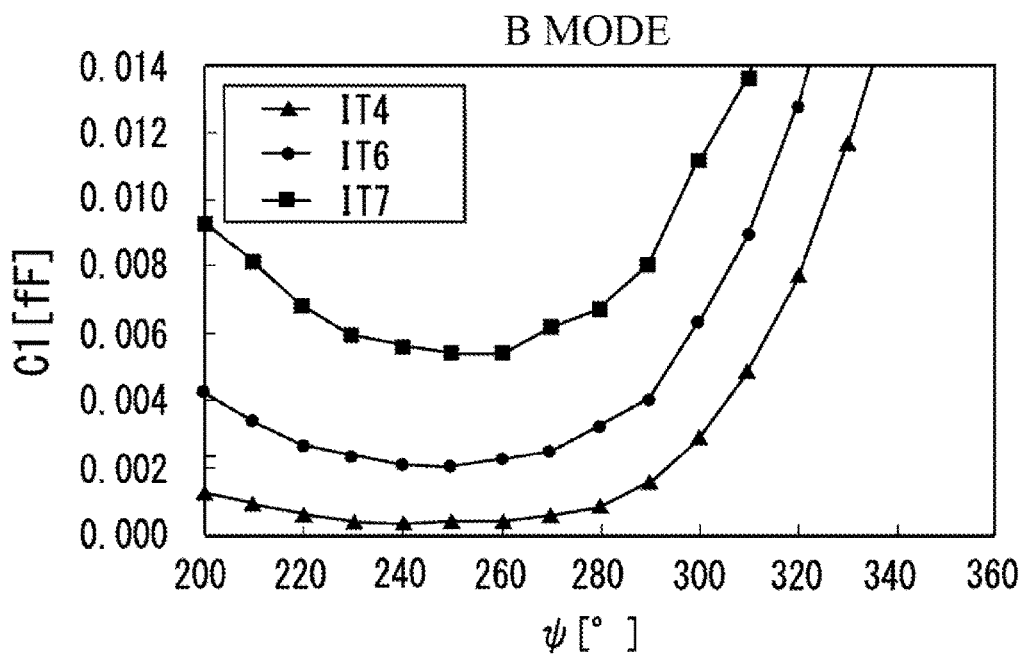

The vibrating piece body of the second modification is IT-cut, and the angle θ is set to 34.410 and the angle ψ is set to 18.94°. FIGS. 9A-9B are graphs illustrating C1 in C mode at IT4, IT6, and IT7 in the case where the angle ψ is changed at the piezoelectric vibrating piece according to the second modification. FIGS. 10A-10B are graphs illustrating C1 in B mode at IT4, IT6, and IT7 in the case where the angle ψ is changed at the piezoelectric vibrating piece according to the second modification. In FIGS. 9A-9B and FIGS. 10A-10B, the vertical axis indicates C1 (unit: fF) and the horizontal axis indicates the angle ψ (unit: °). FIG. 9B and FIG. 10B are enlarged figures of FIG. 9A and FIG. 10A. IT4, IT6, and IT7 have the intervals g different from one another. The intervals g of IT4, IT6, and IT7 are set to −200 (μm), −400 (μm), and −600 (μm), respectively.

As illustrated in FIGS. 9A-9B, it is confirmed that C1 in C mode at IT4, IT6, and IT7 in the case where the angle ψ is changed all becomes the maximum value at the angle ψ close to 290°. As illustrated in FIGS. 10A-10B, it is confirmed that C1 in B mode at IT4, IT6, and IT7 in the case where the angle ψ is changed all becomes the minimum value at the angle ψ close to 230° to 260°.

Thus, it is confirmed that, in the first modification and the second modification, the vibration characteristics in C mode and B mode in the case where the angle ψ is changed are both similar to the above-described piezoelectric vibrating piece 10. That is, it can be said that, when the M-SC-cut or the IT-cut vibrating piece body is employed instead of the SC-cut vibrating piece body, the vibration characteristic in the case where the angle ψ is changed is similar to the above-described piezoelectric vibrating piece 10 (SC cut).

<Graph of Electromechanical Coupling Coefficient $k^2$>

Figure 11A:
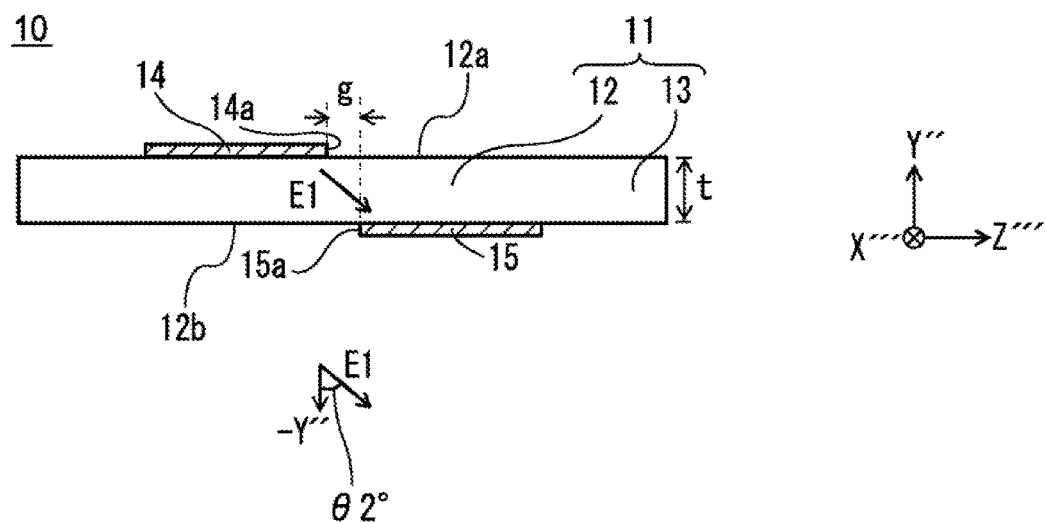
FIGS. 11A-11B are drawings to describe an angle θ2.
Figure 11B:
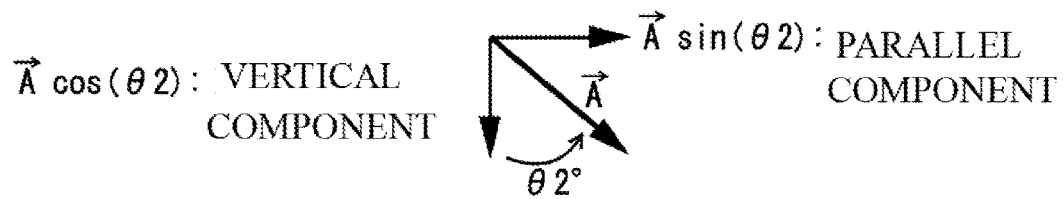
Figure 12A:
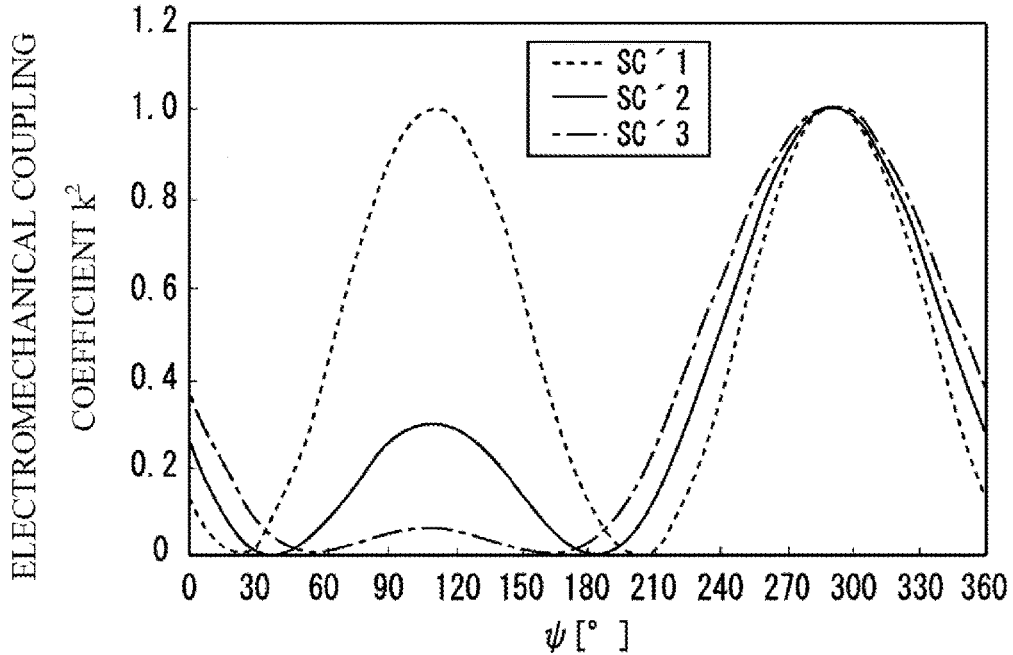
FIG. 12A is a graph illustrating an electromechanical coupling coefficient $k^2$ distribution of the piezoelectric vibrating piece in FIGS. 1A-1D in C mode in the case where the angle ψ is changed.
Figure 12B:
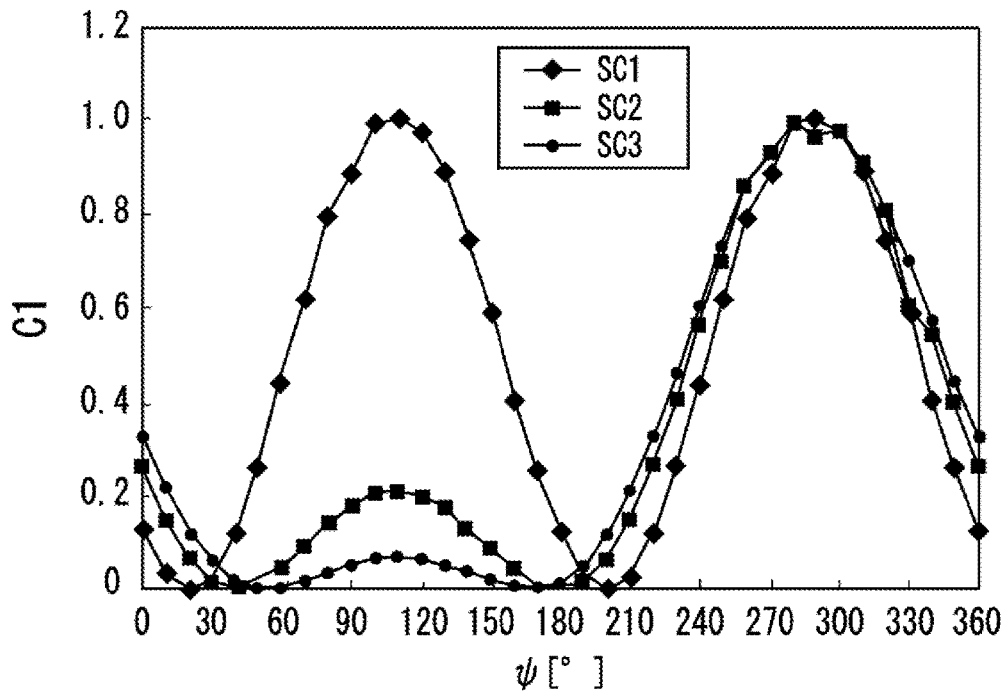
FIG. 12B is a graph illustrating C1 at the piezoelectric vibrating piece in FIGS. 1A-1D in C mode in the case where the angle ψ is changed.

The following describes a relationship between the equivalent series capacitance C1 and the electromechanical coupling coefficient $k^2$ in a proportional relationship. FIGS. 11A-11B are drawings to describe an angle θ2 of the electric field E1 generated in the piezoelectric vibrating piece 10. FIG. 12A is a graph illustrating the electromechanical coupling coefficient $k^2$ distribution of the piezoelectric vibrating piece 10 in FIGS. 1A-1D in C mode in the case where the angle ψ is changed. FIG. 12B is a graph illustrating C1 at the piezoelectric vibrating piece 10 in FIGS. 1A-1D in C mode in the case where the angle ψ is changed.

As illustrated in FIG. 11A, assume that an angle defined by the direction of the electric field E1 generated in the piezoelectric vibrating piece 10 and the −Y'''-direction as θ2. Then, deciding the value of the interval g can calculate the angle θ2 using numerical analysis (a finite element method). Therefore, calculating the respective angles θ2 in the case where the interval g is set to 0 (μm), 100 (μm), and 200 (μm) by the numerical analysis by the finite element method finds that the angle θ2 is 43° with the interval g of 0 (μm) (SC3). Similarly, the angle θ2 is 510 with the interval g of 100 (μm) (SC5), and the angle θ2 is 59° with the interval g of 200 (μm) (SC2). The direction of the electric field E1 is a direction of an electric field generated at an intermediate part of the interval g at the piezoelectric vibrating piece 10 (the intermediate part between the straight line parts 14a and 15a viewed from the Y'''-direction) and the center part of the thickness t (the intermediate part between the front surface 12a and the back surface 12b viewed from the X'''- or Z'''-direction).

Expressing the electric field E1 by vector notation, as illustrated in FIG. 11B, a vector A indicative of the direction and the magnitude of the electric field E1 is found by combining vertical and parallel components using the above-described respective values of the angle θ2. From the value thus combined, the electromechanical coupling coefficient k can be obtained. FIG. 12A is a graph illustrating the electromechanical coupling coefficient $k^2$ distribution in C mode in the case where the angle ψ is changed from 0° to 360° at the piezoelectric vibrating piece 10 with the above-described configuration. In FIG. 12A, the vertical axis indicates the electromechanical coupling coefficient $k^2$ and the horizontal axis indicates the angle ψ (unit: °). The value of the electromechanical coupling coefficient $k^2$ distribution is expressed by normalization. In FIG. 12A, the angle θ2 is 90° at SC'1 and similarly 59° at SC'2 and 43° at SC'3.

FIG. 12B is a graph illustrating C1 in C mode in the case where the angle ψ is changed from 0° to 360° in the piezoelectric vibrating piece 10. In FIG. 12B, the vertical axis indicates C1 and the horizontal axis indicates the angle ψ (unit: °). The value of C1 is expressed by normalization. SC1, SC2, and SC3 in FIG. 12B are each under conditions identical to SC1, SC2, and SC3 illustrated in FIGS. 2A-2C and FIGS. 3A-3C, and the intervals g of SC2 and SC3 are set to 200 (μm) and 0 (μm), respectively.

It is confirmed from a comparison between FIG. 12A and FIG. 12B that the shapes of the graphs almost match with one another. In the case where the angle ψ is changed, it is confirmed that the distribution of C1 at SC2 approximates the electromechanical coupling coefficient $k^2$ distribution of SC'2 and the distribution of C1 at SC3 approximates the electromechanical coupling coefficient $k^2$ distribution of SC'3. That is, in the case where the angle ψ is changed, it is confirmed that the normalized C1 values almost match the values of the electromechanical coupling coefficient $k^2$ distribution calculated and normalized on the basis of the angle θ2 with one another.

From this fact, it is found that an outline of the change in C1 in the case where the angle ψ is changed can be grasped through the calculation of the electromechanical coupling coefficient k in the case where the angle v is changed using the angle θ2 value obtained from the interval g. The electromechanical coupling coefficient k is calculated in a short time compared with the calculation of C1 using the numerical analysis (the finite element method). Therefore, the calculation of the electromechanical coupling coefficient k allows quickly grasping the outline of change in C1 in the case where the angle ψ is changed. Therefore, the following describes the electromechanical coupling coefficient $k^2$ distribution in the case where the angle ψ is changed in the piezoelectric vibrating piece with the above-described configuration with reference to the drawings.

Figure 13A:
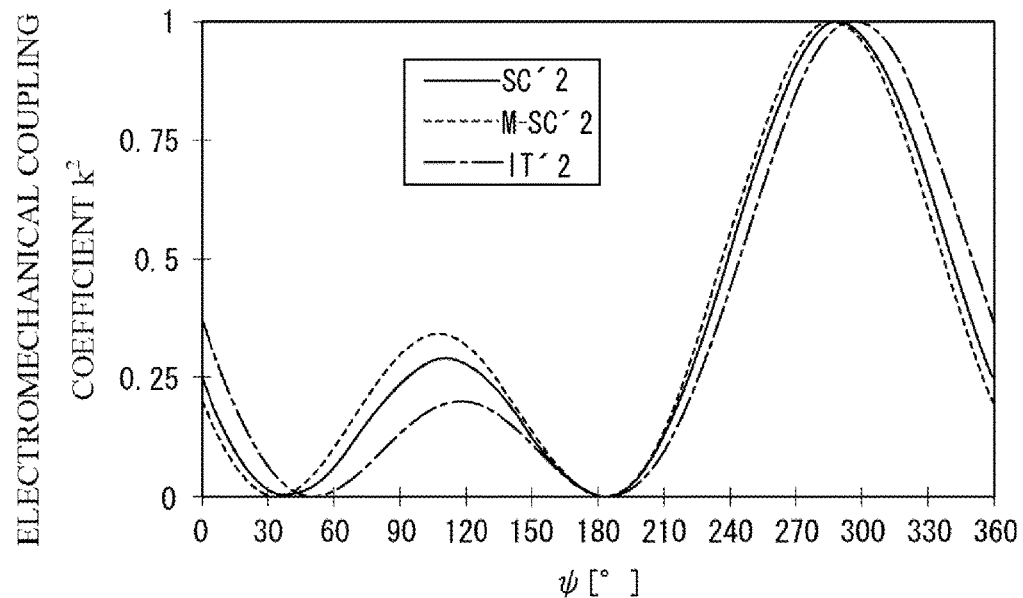
FIGS. 13A-13B illustrate the electromechanical coupling coefficient $k^2$ distributions of the piezoelectric vibrating pieces in FIGS. 1A-1D and according to the first modification and the second modification in the case where the angle ψ is changed.
Figure 13B:
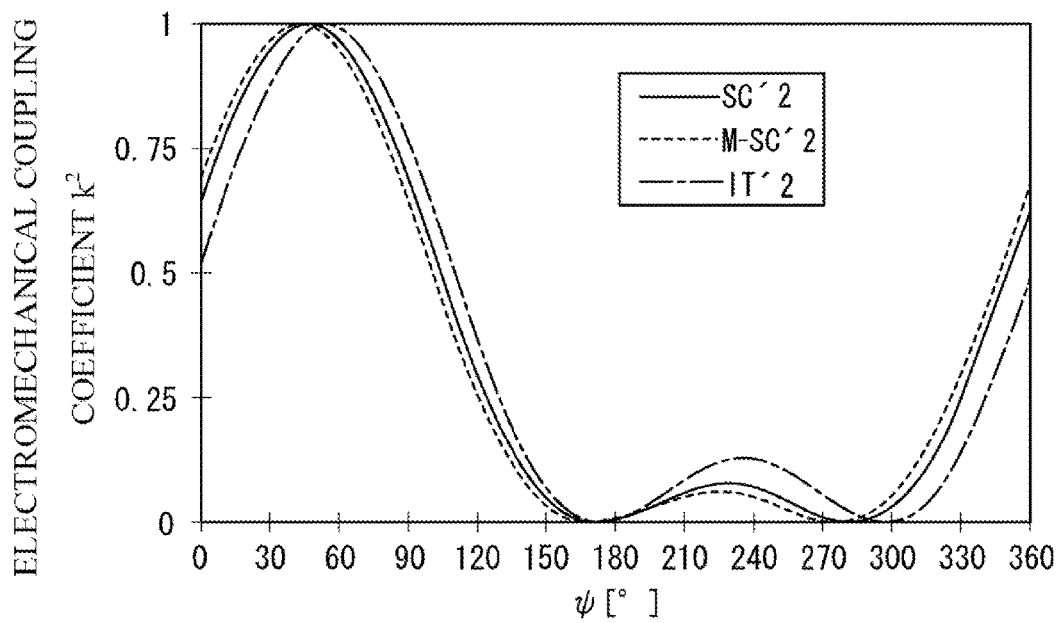

FIGS. 13A-13B are graphs illustrating the electromechanical coupling coefficient $k^2$ distributions in the case where the angle ψ is changed from 0° to 360° at the piezoelectric vibrating piece 10, the piezoelectric vibrating piece according to the first modification, and the piezoelectric vibrating piece according to the second modification. FIG. 13A is the graph in C mode, and FIG. 13B is the graph in B mode. In FIG. 13A and FIG. 13B, the vertical axis indicates the normalized electromechanical coupling coefficient $k^2$ and the horizontal axis indicates the angle ψ (unit: °). In FIG. 13A and FIG. 13B, SC'2, M-SC'2, and IT'2 are graphs of the respective piezoelectric vibrating piece 10, piezoelectric vibrating piece according to the first modification, and piezoelectric vibrating piece according to the second modification, and the angles θ2 are all 59° (the interval g: 200 (μm)). As illustrated in FIG. 13A and FIG. 13B, it is confirmed that the changes in the electromechanical coupling coefficient $k^2$ distribution of M-SC'2 and IT'2 in the case where the angle ψ is changed are similar to SC'2. Thus, also judging from the graphs of the electromechanical coupling coefficient $k^2$ distributions illustrated in FIGS. 13A-13B, it is confirmed that, with the use of the M-SC cut or IT-cut vibrating piece body as the vibrating piece body, the vibration characteristic in the case where the angle ψ is changed is similar to the vibration characteristic of the SC-cut vibrating piece body.

Figure 14A:
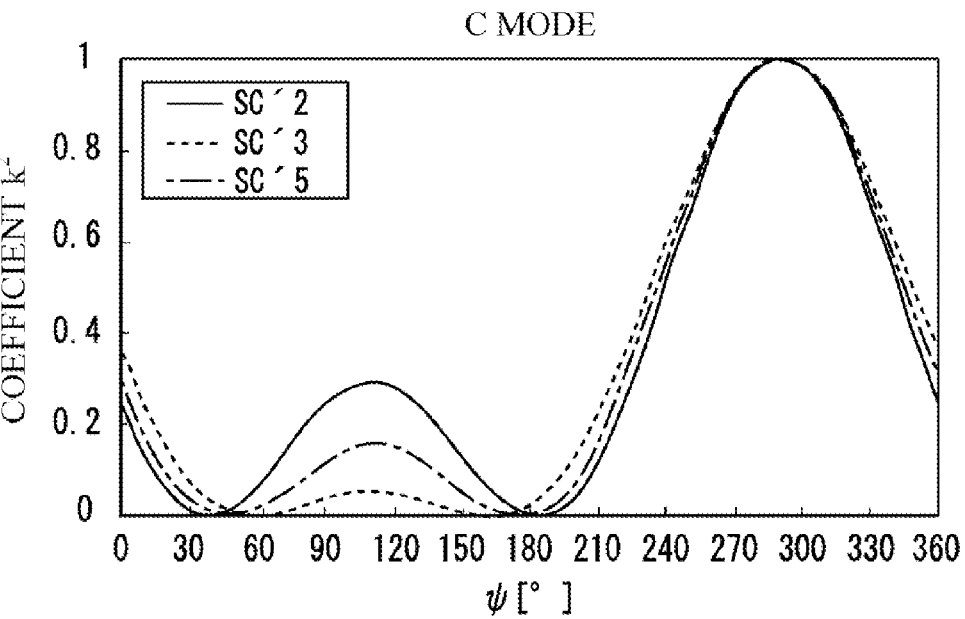
FIGS. 14A-14B are graphs illustrating the electromechanical coupling coefficient $k^2$ distributions of the piezoelectric vibrating piece in FIGS. 1A-1D in C mode in the case where the angle ψ is changed.
Figure 14B:
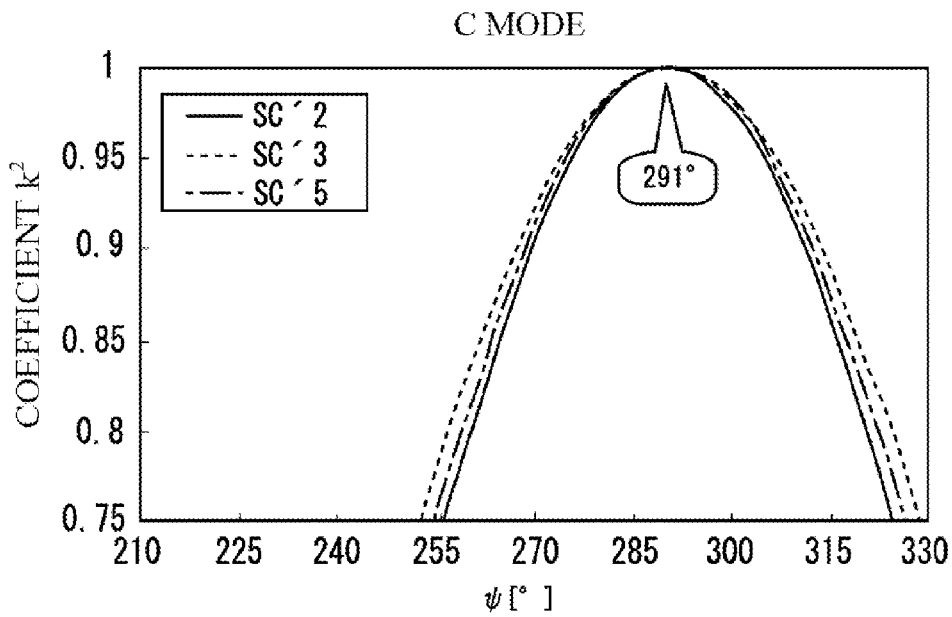
Figure 15A:
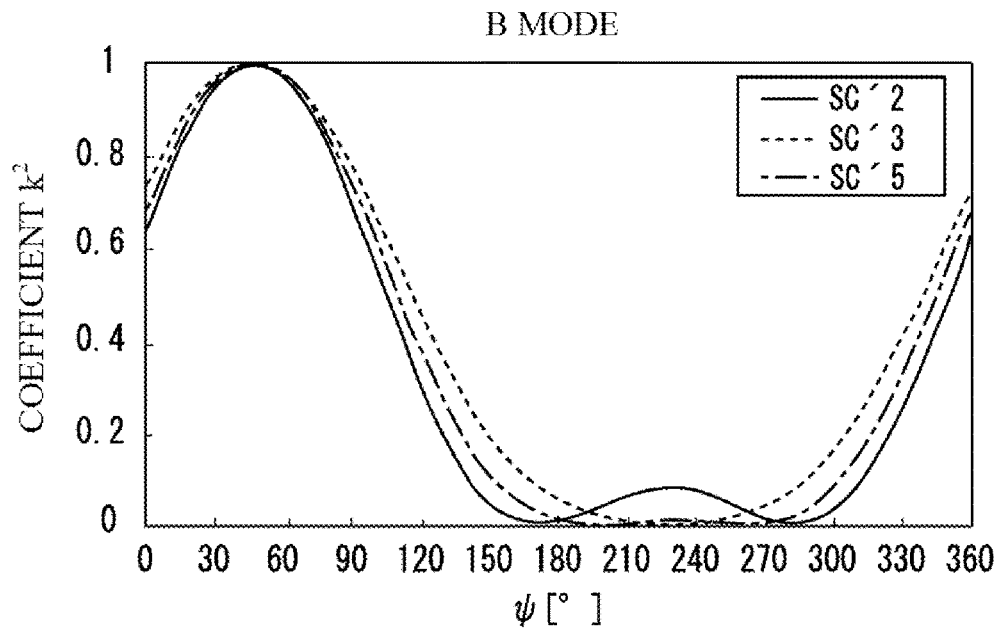
FIGS. 15A-15B are graphs illustrating the electromechanical coupling coefficient $k^2$ distributions of the piezoelectric vibrating piece in FIGS. 1A-1D in B mode in the case where the angle ψ is changed.
Figure 15B:
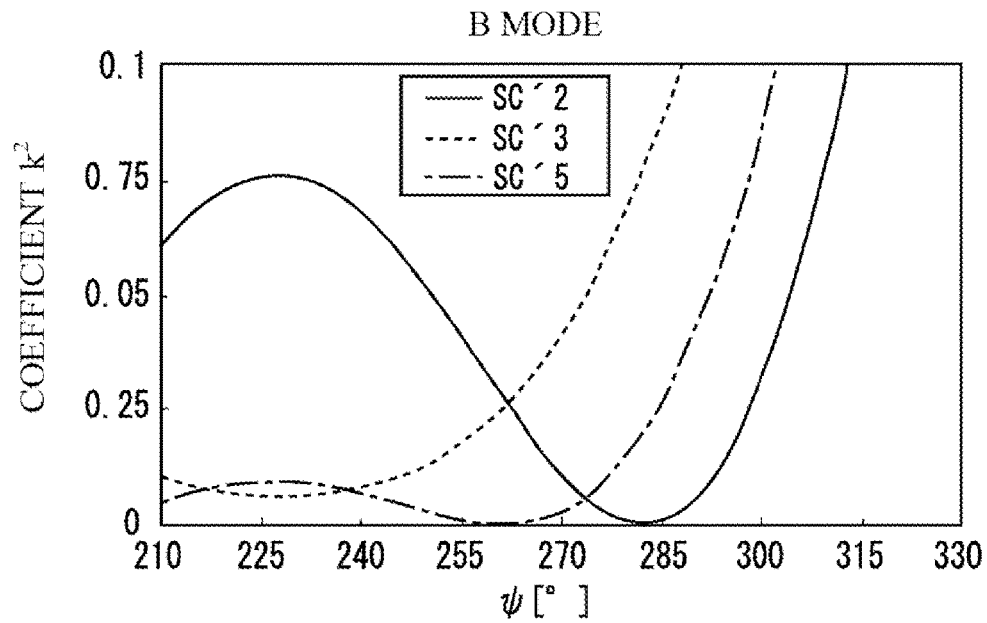

FIGS. 14A-14B are graphs illustrating the electromechanical coupling coefficient $k^2$ distributions in C mode in the case where the angle ψ is changed at the piezoelectric vibrating piece 10 that includes the SC-cut vibrating piece body. In FIG. 14A and FIG. 14B, the vertical axis indicates the normalized electromechanical coupling coefficient $k^2$ and the horizontal axis indicates the angle ψ (unit: °). Although FIG. 14B is a graph similar to FIG. 14A, FIG. 14B illustrates the graph with electromechanical coupling coefficient $k^2$ indicated in the vertical axis of 0.75 to 1 and the angle ψ indicated in the horizontal axis of 210° to 330°. FIGS. 15A-15B are graphs illustrating the electromechanical coupling coefficient $k^2$ distributions in B mode in the case where the angle ψ is changed at the piezoelectric vibrating piece 10. In FIG. 15A and FIG. 15B, the vertical axis indicates the normalized electromechanical coupling coefficient $k^2$ and the horizontal axis indicates the angle ψ (unit: °). Although FIG. 15B is a graph similar to FIG. 15A, FIG. 15B illustrates the graph with electromechanical coupling coefficient $k^2$ indicated in the vertical axis of 0 to 0.1 and the angle ψ indicated in the horizontal axis of 210° to 330°.

In FIGS. 14A-14B and FIGS. 15A-15B, SC'5 has the angle θ2 of 51° (the interval g: 100 (μm)). As described above, the angles θ2 of SC'2 and SC'3 are 59° (the interval g: 200 (μm)) and 43° (the interval g: 0 (μm)), respectively.

As illustrated in FIGS. 14A-14B, it is confirmed that, the electromechanical coupling coefficient $k^2$ distributions of SC'2, SC'3, and SC'5 in C mode all become the maximum values with the angle ψ of 291°. As illustrated in FIGS. 15A-15B, it is confirmed that, in the electromechanical coupling coefficient $k^2$ distributions in B mode, SC'2 becomes the minimum value at the angle ψ close to 285° and SC'5 becomes the minimum value at the angle ψ close to 2600. Accordingly, it is considered that, with the piezoelectric vibrating piece 10 with the angle θ2 set to about 50° to 60° and the interval g set to 100 (μm) to 200 (μm), the B mode can be almost fully suppressed with the angle ψ of 260° to 285° and the C mode can be effectively excited while the B mode is restrained with the angle ψ of 291°.

Figure 16A:
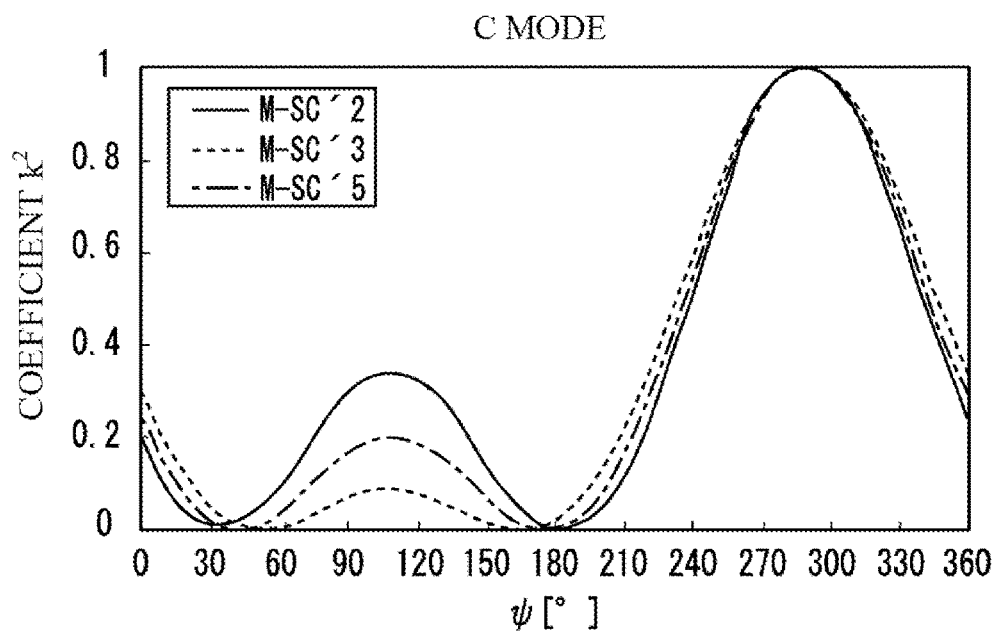
FIGS. 16A-16B are graphs illustrating the electromechanical coupling coefficient $k^2$ distributions in C mode according to the first modification in the case where the angle ψ is changed.
Figure 16B:
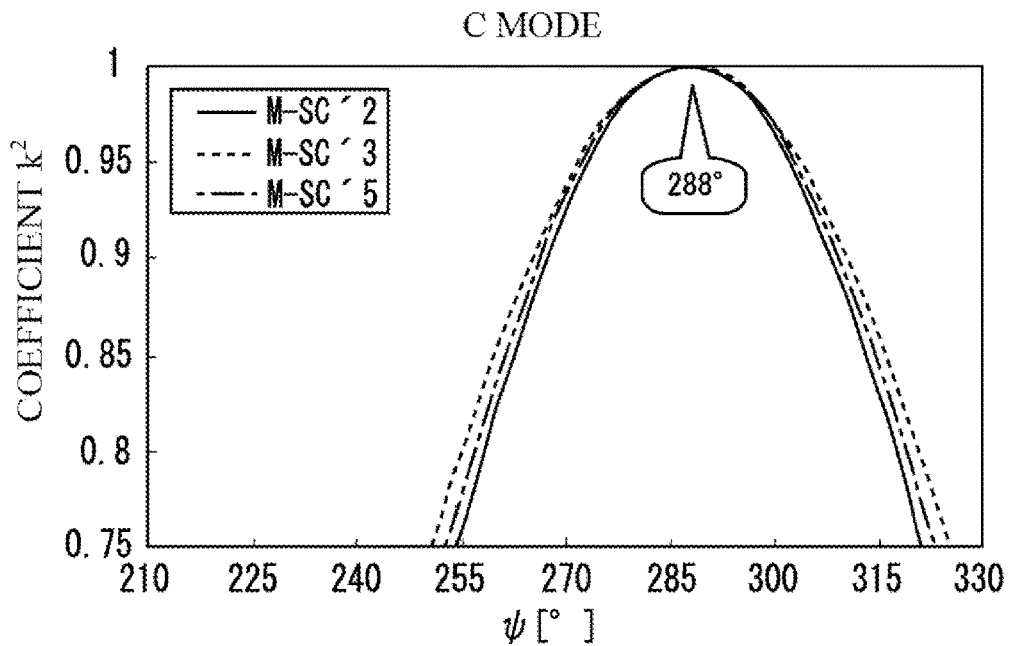
Figure 17A:
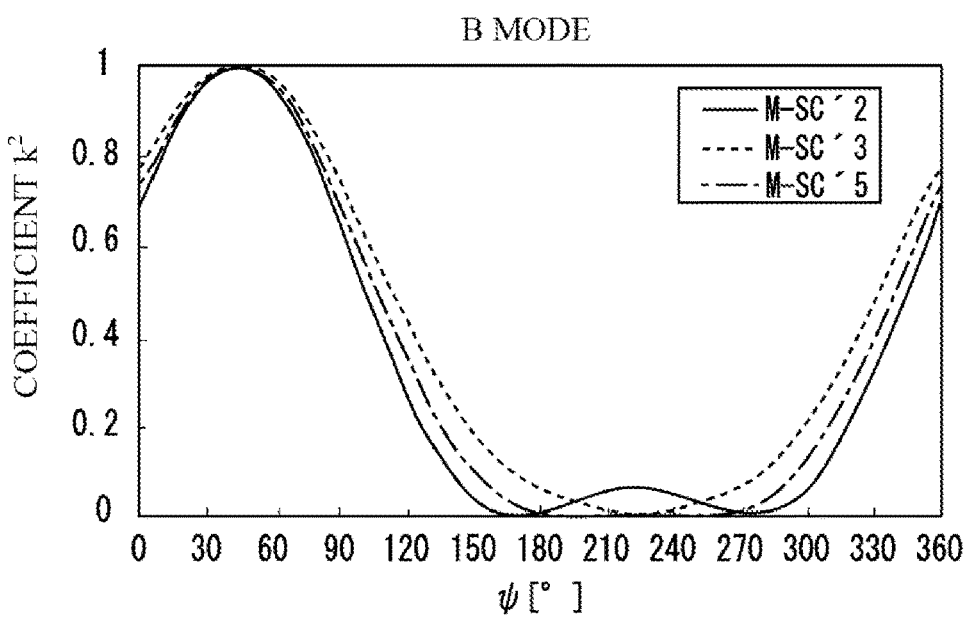
FIGS. 17A-17B are graphs illustrating the electromechanical coupling coefficient $k^2$ distributions in B mode according to the first modification in the case where the angle ψ is changed.
Figure 17B:
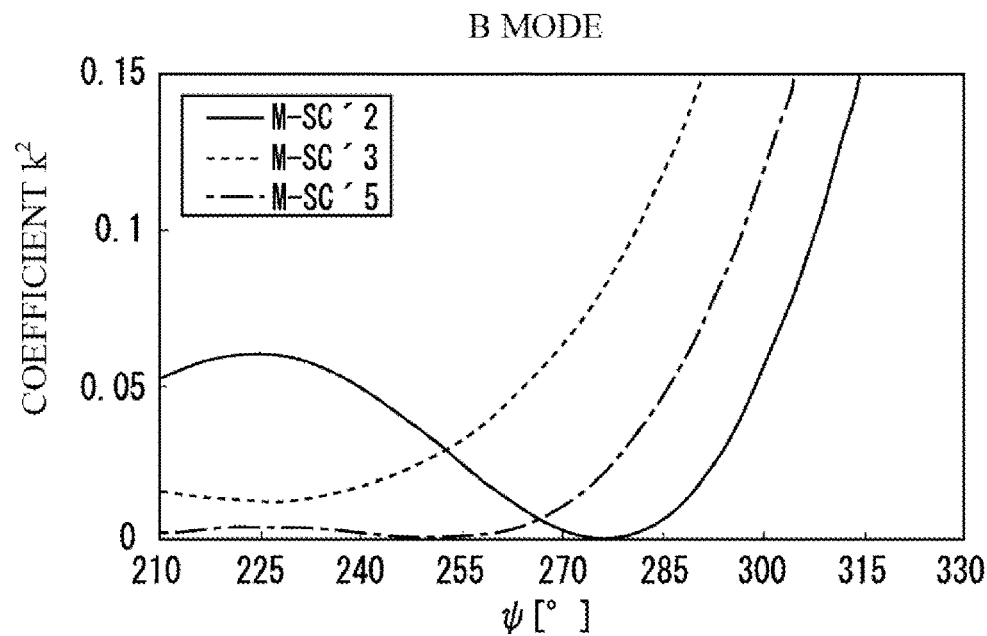

FIGS. 16A-16B are graphs illustrating the electromechanical coupling coefficient $k^2$ distributions in C mode in the case where the angle ψ is changed in the piezoelectric vibrating piece according to the first modification. In FIG. 16A and FIG. 16B, the vertical axis indicates the normalized electromechanical coupling coefficient $k^2$ and the horizontal axis indicates the angle ψ (unit: °). Although FIG. 16B is a graph similar to FIG. 16A, FIG. 16B illustrates the graph with electromechanical coupling coefficient $k^2$ indicated in the vertical axis of 0.75 to 1 and the angle ψ indicated in the horizontal axis of 210° to 330°. FIGS. 17A-17B are graphs illustrating the electromechanical coupling coefficient $k^2$ distributions in B mode in the case where the angle ψ is changed in the piezoelectric vibrating piece according to the first modification. In FIG. 17A and FIG. 17B, the vertical axis indicates the normalized electromechanical coupling coefficient $k^2$ and the horizontal axis indicates the angle ψ (unit: °). Although FIG. 16B is a graph similar to FIG. 16A, FIG. 16B illustrates the graph with electromechanical coupling coefficient $k^2$ indicated in the vertical axis of 0 to 0.15 and the angle ψ indicated in the horizontal axis of 210° to 330°.

In FIGS. 16A-16B and FIGS. 17A-17B, M-SC'2, M-SC'3, and M-SC'5 have the angles θ2 of 59° (the interval g: 200 (μm)), 43° (the interval g: 0 (μm)), and 51° (the interval g: 100 (μm)), respectively.

As illustrated in FIGS. 16A-16B, it is confirmed that, the electromechanical coupling coefficient $k^2$ distributions of M-SC'2, M-SC'3, and M-SC'5 in C mode all become the maximum values with the angle ψ of 288°. As illustrated in FIGS. 17A-17B, it is confirmed that, in the electromechanical coupling coefficient $k^2$ distributions in B mode, M-SC'2 becomes the minimum value at the angle ψ close to 280° and M-SC'5 becomes the minimum value at the angle ψ close to 250°. Accordingly, it is considered that, with the piezoelectric vibrating piece according to the first modification with the angle θ2 set to about 50° to 60° and the interval g set to 100 (μm) to 200 (μm), the B mode can be almost fully suppressed with the angle ψ of 250° to 280° and the C mode can be effectively excited while the B mode is restrained with the angle ψ of 288°.

Figure 18A:
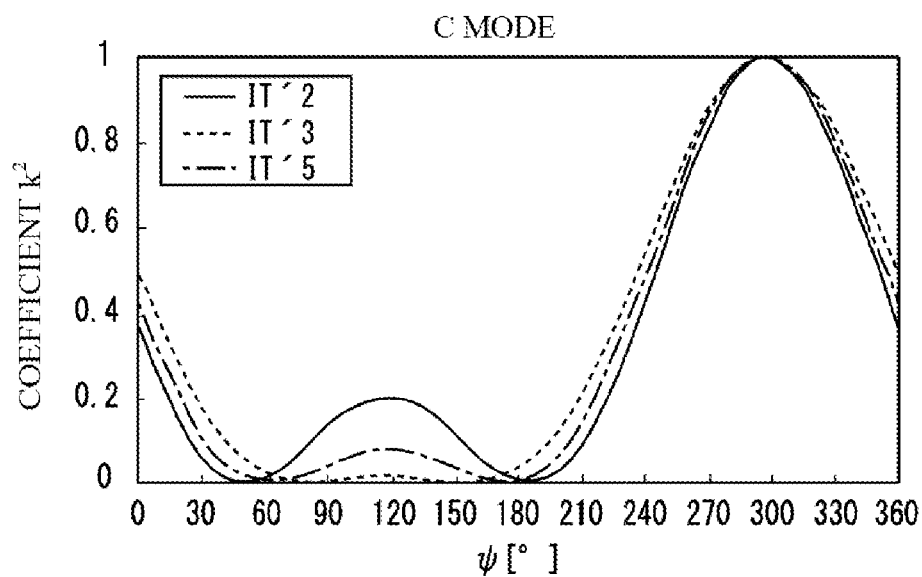
FIGS. 18A-18B are graphs illustrating the electromechanical coupling coefficient $k^2$ distributions in C mode according to the second modification in the case where the angle ψ is changed.
Figure 18B:
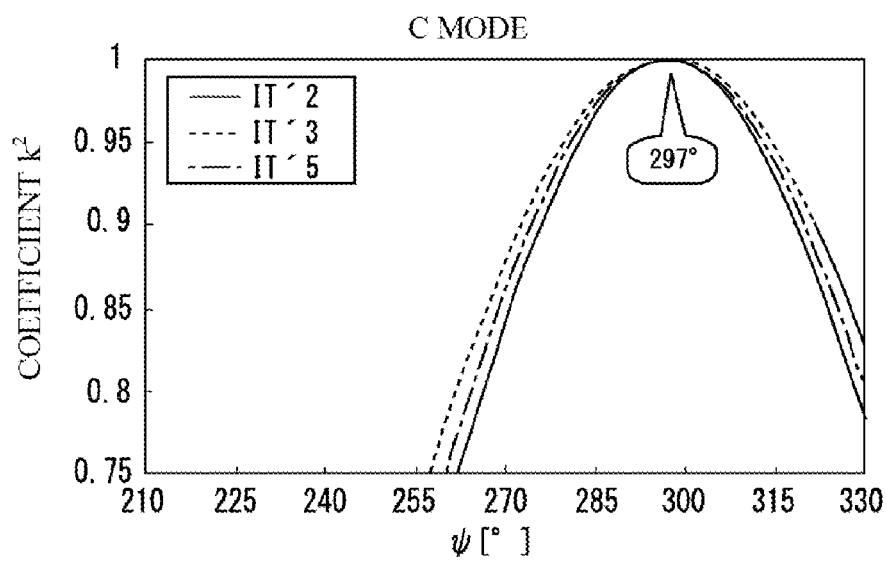
Figure 19A:
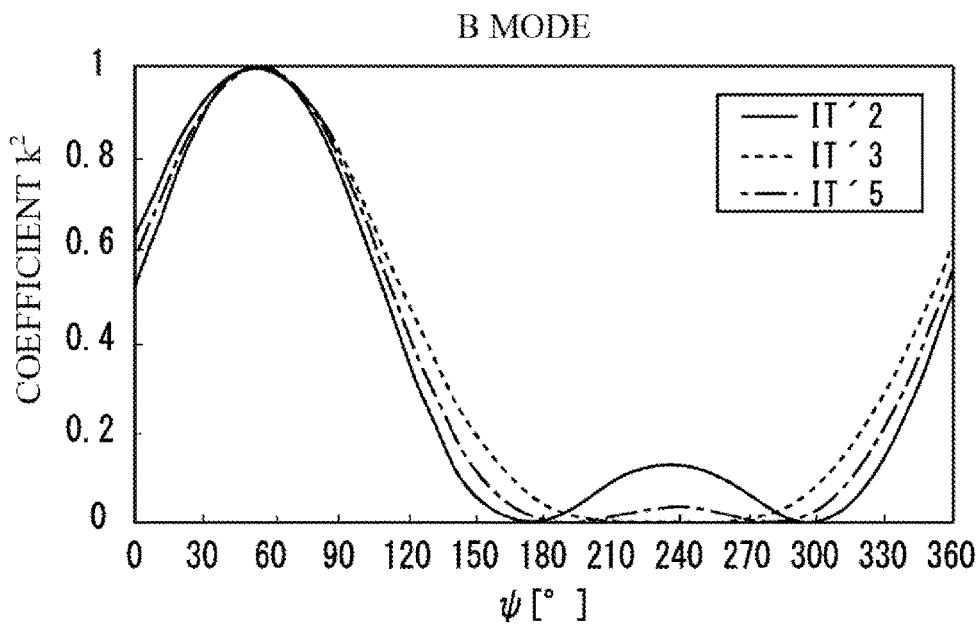
FIGS. 19A-19B are graphs illustrating the electromechanical coupling coefficient $k^2$ distributions in B mode according to the second modification in the case where the angle ψ is changed.
Figure 19B:
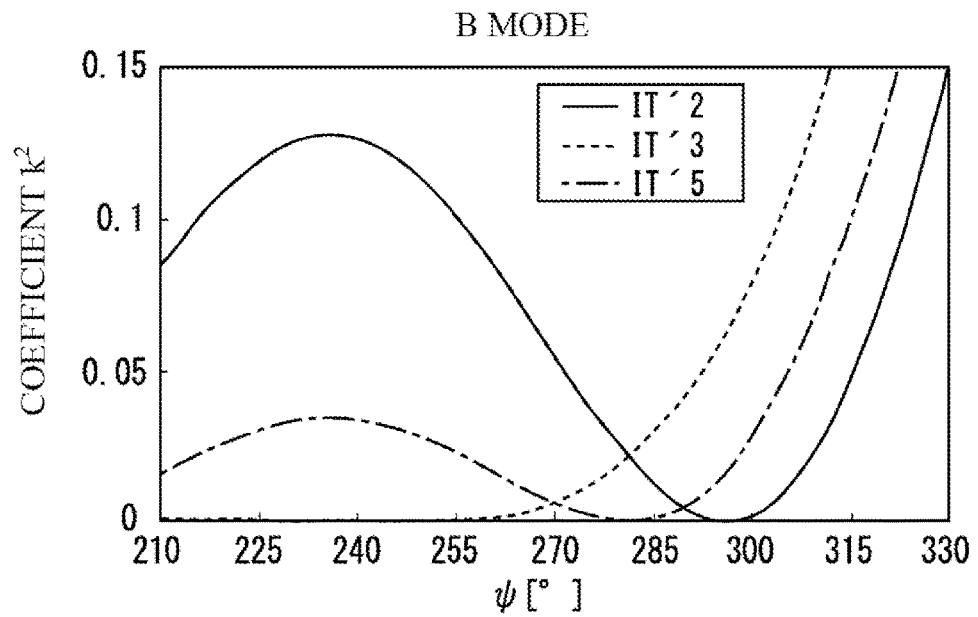

FIGS. 18A-18B are graphs illustrating the electromechanical coupling coefficient $k^2$ distributions in C mode in the case where the angle ψ is changed in the piezoelectric vibrating piece according to the second modification. In FIG. 18A and FIG. 18B, the vertical axis indicates the normalized electromechanical coupling coefficient $k^2$ and the horizontal axis indicates the angle ψ (unit: °). Although FIG. 18B is a graph similar to FIG. 18A, FIG. 18B illustrates the graph with electromechanical coupling coefficient $k^2$ indicated in the vertical axis of 0.75 to 1 and the angle ψ indicated in the horizontal axis of 210° to 330°. FIGS. 19A-19B are graphs illustrating the electromechanical coupling coefficient $k^2$ distributions in B mode in the case where the angle ψ is changed in the piezoelectric vibrating piece according to the second modification. In FIG. 19A and FIG. 19B, the vertical axis indicates the normalized electromechanical coupling coefficient $k^2$ and the horizontal axis indicates the angle ψ (unit: °). Although FIG. 19B is a graph similar to FIG. 19A, FIG. 19B illustrates the graph with electromechanical coupling coefficient $k^2$ indicated in the vertical axis of 0 to 0.15 and the angle ψ indicated in the horizontal axis of 210° to 330°.

In FIGS. 18A-18B and FIGS. 19A-19B, IT'2, IT'3, and IT'5 have the angles θ2 of 59° (the interval g: 200 (μm)), 43° (the interval g: 0 (μm)), and 51° (the interval g: 100 (μm)), respectively.

As illustrated in FIGS. 18A-18B, it is confirmed that in the electromechanical coupling coefficient $k^2$ distributions in C mode, IT'3, IT'5, and IT'2 all become the maximum values with the angle ψ of 297°. As illustrated in FIGS. 19A-19B, it is confirmed that, in the electromechanical coupling coefficient $k^2$ distributions in B mode, IT'2 becomes the minimum value with the angle ψ close to 300° and IT'5 becomes the minimum value with the angle ψ close to 280°. Accordingly, it is considered that, with the angle θ2 set to about 50° to 60° and the interval g set to 100 (μm) to 200 (μm), the piezoelectric vibrating piece according to the second modification can almost fully suppress the B mode with the angle ψ of 280° to 300° and can effectively excite the C mode while restraining the B mode with the angle ψ of 297°.

The electromechanical coupling coefficient $k^2$ distributions in the case where the angle ψ is changed in the first modification and the second modification are described using FIGS. 16A-16B to FIGS. 19A-19B. As described above, since the electromechanical coupling coefficient $k^2$ distribution almost matches the C1 distribution in the case where the angle ψ is changed, graph data regarding these electromechanical coupling coefficient $k^2$ distributions complement insufficient data regarding C1 of the piezoelectric vibrating piece under the identical conditions.

Second Embodiment

Figure 21A:
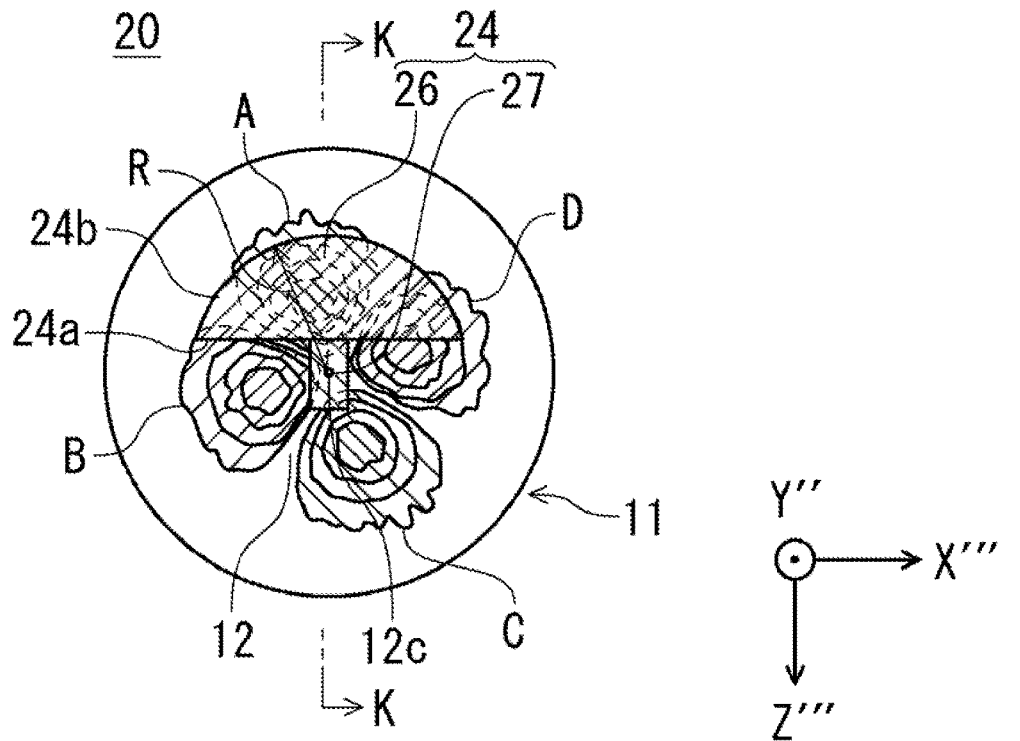
FIGS. 21A-21C illustrate an example of a piezoelectric vibrating piece according to the second embodiment.
Figure 21B:
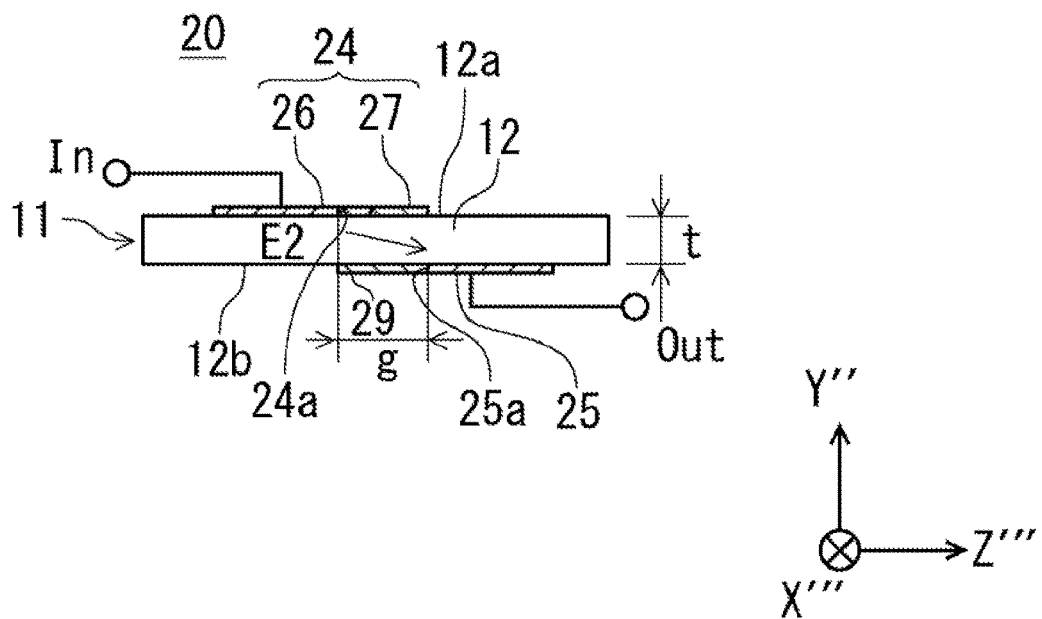
Figure 21C:
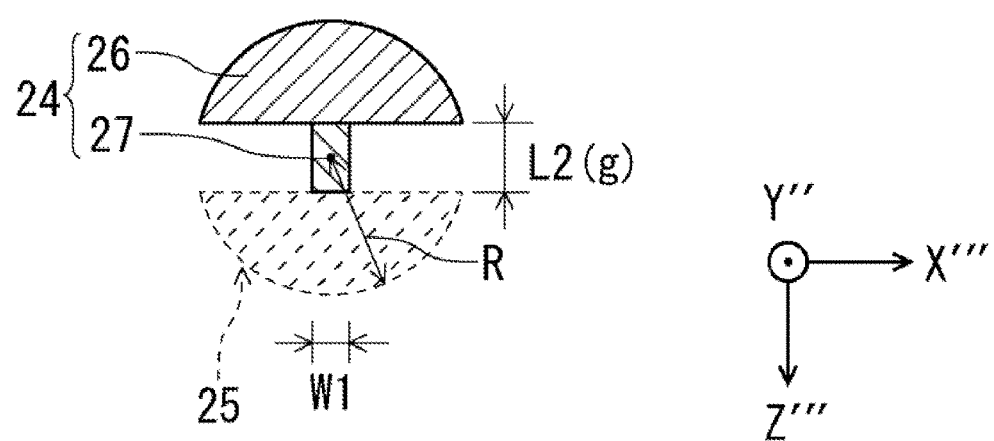

The following describes a piezoelectric vibrating piece according to the second embodiment with reference to the drawings. Like reference numerals designate corresponding or identical elements with the first embodiment, and therefore such elements will not be further elaborated here. FIGS. 21A-21C illustrates an example of the piezoelectric vibrating piece according to the second embodiment, FIG. 21A is the plan view, FIG. 21B is a cross-sectional view taken along a line K-K in FIG. 21A, and FIG. 21C is a plan view of main parts.

As illustrated in FIG. 21B and FIG. 21C, a piezoelectric vibrating piece 20 includes a pair of excitation electrodes 24 and 25. The excitation electrode 24 is formed on the front surface 12a of the vibrator 12. The excitation electrode 25 is formed on the back surface 12b of the vibrator 12. The excitation electrode 25 is disposed symmetrically to the excitation electrode 24 with respect to a straight line parallel to the X'''-axis direction and passing through a center of a thickness at a center of the vibrating piece body 11 viewed from the Y''-axis direction.

The pair of excitation electrodes 24 and 25 are collocated in the Z'''-axis direction determined by the X'''-axis direction, which is defined by counterclockwise rotation from the X''-axis direction around the Y''-axis by the angle ψ. As illustrated in FIG. 21B, the excitation electrodes 24 and 25 are disposed in a direction inclined with respect to the Y''-axis direction. When the excitation electrodes 24 and 25 apply an electric field E2 on the vibrator 12 in the direction inclined with respect to the Y''-axis direction, the vibrator 12 vibrates at a predetermined frequency. The direction of the electric field E2 illustrated in FIG. 21B shows a case where the excitation electrode 24 is configured as an input side and the excitation electrode 25 is configured as an output side. Embodiments described later also generate an electric field in the similar direction.

The excitation electrode 24 includes a main portion 26 and a protrusion 27. The main portion 26 and the protrusion 27 are electrically connected to one another. The main portion 26 and the protrusion 27 are integrally formed but are not limited to this configuration. The main portion 26 is formed in a region on the −Z'''-side of the front surface 12a of the vibrator 12. The main portion 26 has an approximately semicircular shape viewed from the Y''-axis direction. The main portion 26 has a straight line part 24a parallel to the X'''-axis direction at the end portion on the +Z'''-side. The main portion 26 includes an arc part 24b that connects both end portions of the straight line part 24a.

The protrusion 27 is formed projecting from the straight line part 24a in the +Z'''-axis direction. The protrusion 27 is formed in a region including the center 12c of the vibrator 12 viewed from the Y''-axis direction and a rectangular region having side portions parallel to the Z'''-axis direction and the X'''-axis direction. As illustrated in FIG. 21C, the width of the protrusion 27 in the X'''-axis direction (a length of the side portions parallel to the X'''-axis direction) is set to W1, and a length in the Z'''-axis direction (a length of the side portions parallel to the Z'''-axis direction) is set to L2. The protrusion 27 is formed so as to overlap a protrusion 29 formed on the back surface 12b of the vibrator 12 in the Y''-axis direction.

Figure 20A:
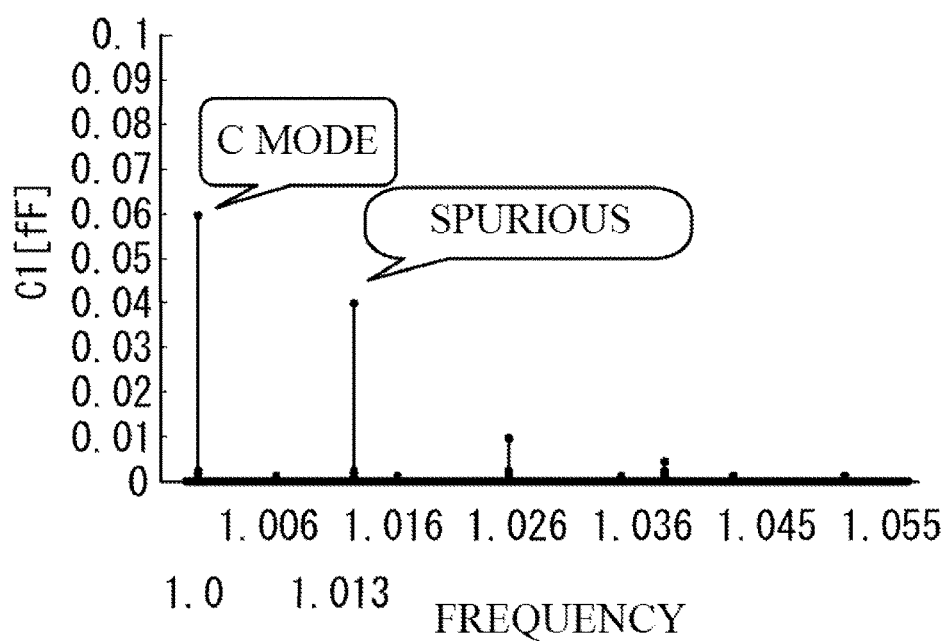
FIG. 20A is a drawing illustrating a relationship between C1 and a resonance frequency.
Figure 20B:
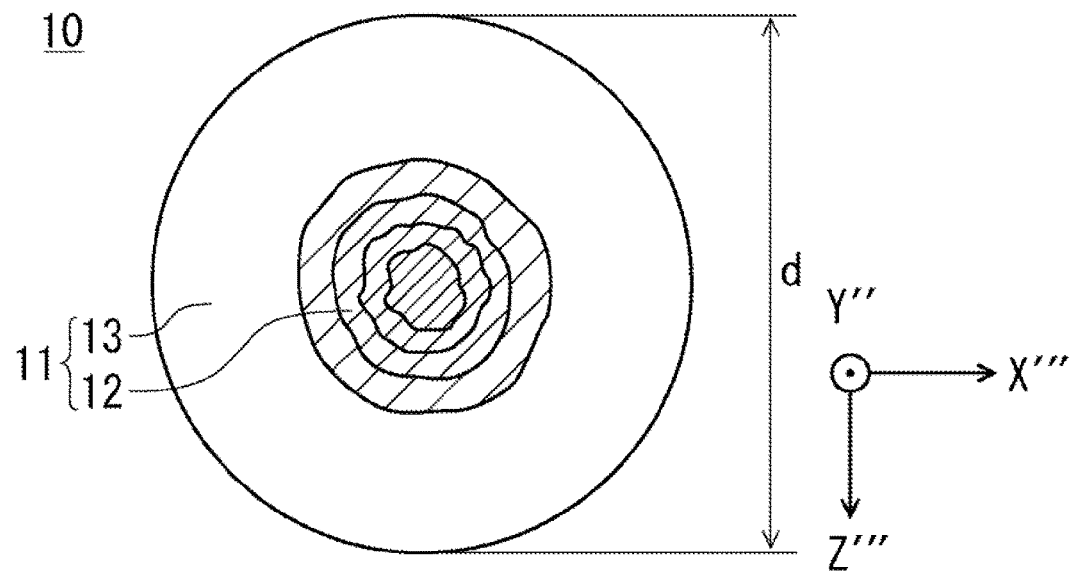
FIG. 20B is a plan view illustrating a vibration displacement in C mode.
Figure 20C:
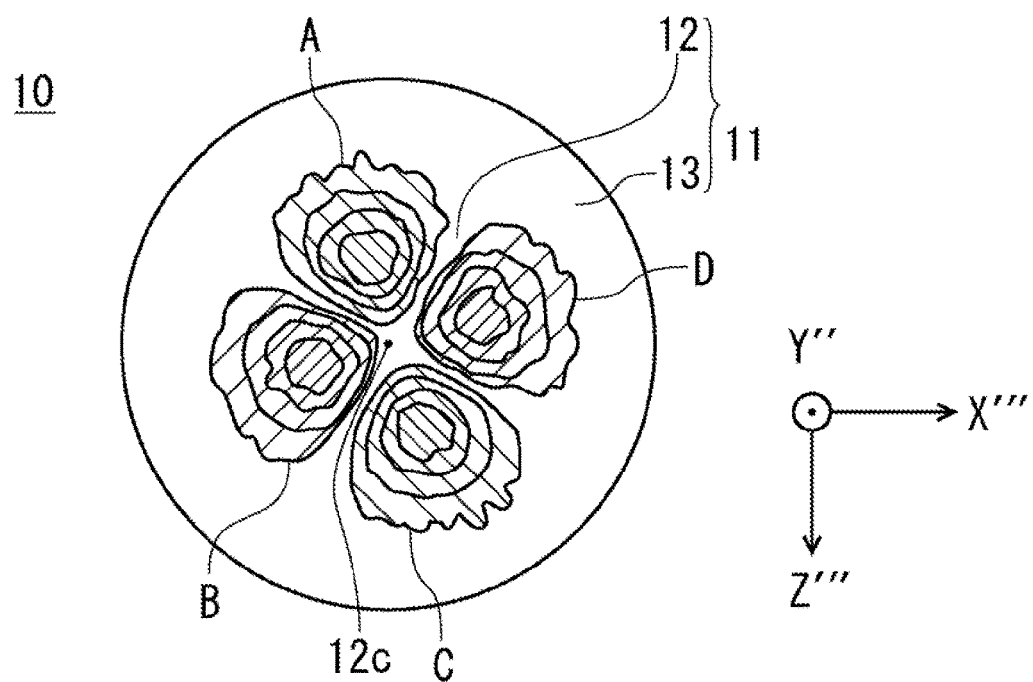
FIG. 20C is a plan view illustrating the vibration displacement caused by a spurious.

The following describes the vibration characteristic of the piezoelectric vibrating piece 10 with the angle ψ set to 280° with reference to FIGS. 20A-20C. FIG. 20A is a drawing illustrating a relationship between C1 and a resonance frequency. In FIG. 20A, the vertical axis indicates C1 (unit: fF), and the horizontal axis indicates a normalized frequency normalized using the frequency in C mode as the reference. As illustrated in FIG. 20A, the C mode with C1 of around 0.06 (fF) is generated. This CI in C mode is around 208 (Ω). A comparatively large spurious with frequency different from a desired frequency is generated at a frequency near the frequency in C mode. That is, the spurious with C1 of around 0.039 (fF) is generated in the proximity of 1.013 of reference frequency. CI of this spurious is 312 (Ω). FIG. 20A uses the piezoelectric vibrating piece 10 with the angle ψ set to 280°. However, in the case where the angle ψ is not 280° as well, as long as the angle ψ is in a range of 260° to 300°, the similar trend is exhibited. The vibrating piece body 11 in this case is configured to have the convex shape on one surface with curvature radius of 240 (mm), respective dimensions are set: a diameter d of 8 (mm) and the thickness t of the vibrator 12 of 546 (μm), and the third harmonic at 10 (MHz) is set as the desired frequency. A distance R is set to 2.4 (mm). The vibrating piece body 11 for the graphs in FIG. 22D, FIG. 22E, FIG. 23C, FIG. 23D, FIG. 24C, and FIG. 24D, which will be described later, also use the similar configuration.

FIG. 20B is a drawing illustrating a displacement region of the surface of the piezoelectric vibrating piece 10 in the Z'''-axis direction in C mode and a magnitude of the displacement. The drawing expresses a largely displaced part with hatching intervals narrower compared with the circumference, and the same goes for FIG. 20C. As illustrated in FIG. 20B, it is confirmed that, in C mode, the displacement region in the Z'''-axis direction occurs in a region at the center part of the piezoelectric vibrating piece 10.

FIG. 20C is a drawing illustrating the displacement of the piezoelectric vibrating piece 10 in the Z'''-axis direction caused by the spurious and the magnitude of the displacement. As illustrated in FIG. 20C, it is confirmed that the spurious generates the displacement in the Z'''-axis direction at the four regions on the surface of the piezoelectric vibrating piece 10. Among these four regions, a region on the −X'''-side and the −Z'''-side of the piezoelectric vibrating piece 10 is defined as a displacement region A. The regions are defined as displacement regions A, B, C, and D in the clockwise direction order around the center part of the piezoelectric vibrating piece 10. The part A and the part C are in the identical phase, and the part B and the part D are in the identical phase. The parts B and D are reverse phases (reverse displacement directions) to one another with respect to the part A (the part C).

As illustrated in FIG. 21A, the excitation electrode 24 is formed in a region outside of displacement regions B and D. This restrains picking up electric charges generated in the parts B and D. The protrusion 27 is formed in the region that includes the center 12c of the vibrator 12 where the C mode is strongly generated. This ensures securing C1 in C mode, ensuring obtaining the larger C mode. Furthermore, the protrusion 27 allows easily picking up electric charges with different sign from the parts B and D generated through vibrations of the displacement region C. This offsets the electric charges, thereby ensuring restraining an unnecessary influence from the spurious.

Figure 22D:
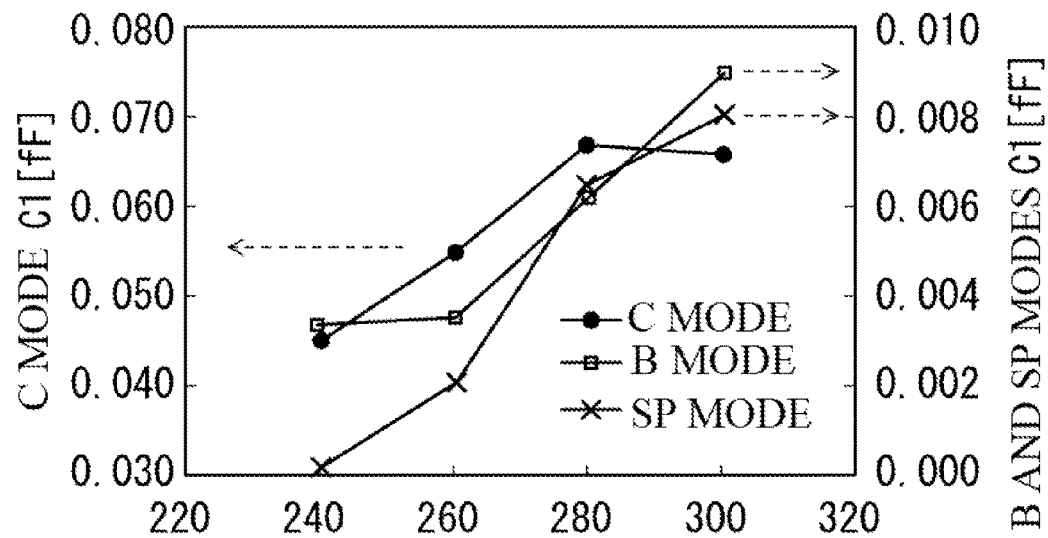
FIGS. 22D-22E illustrate a vibration characteristic of the piezoelectric vibrating piece in FIGS. 21A-21C in the case where the angle ψ is changed.
Figure 22E:
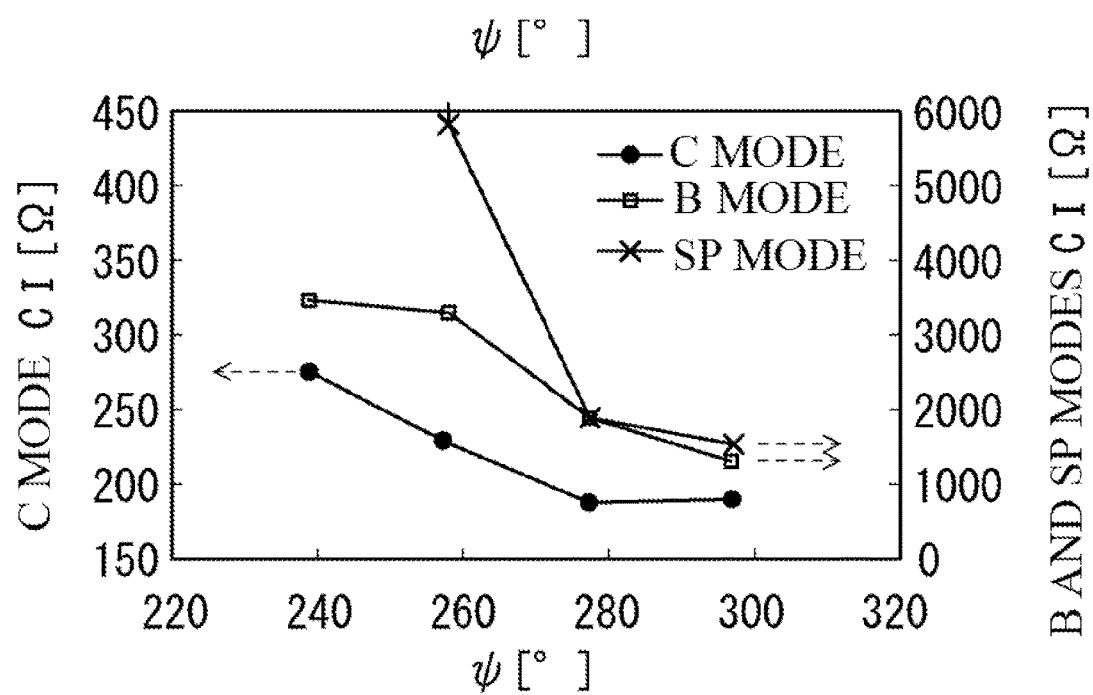

FIG. 22D and FIG. 22E are graphs illustrating the vibration characteristic of the piezoelectric vibrating piece 20. FIG. 22D is a graph illustrating C1 in the case where the angle ψ is changed. In FIG. 22D, the vertical axis on the left side of the graph indicates C1 in C mode (unit: fF), the vertical axis on the right side of the graph indicates C1 in B mode and spurious (unit: fF), and the horizontal axis indicates the angle ψ (unit: °). The same goes for the graphs illustrated in FIG. 23C and FIG. 24C, which will be described later.

FIG. 22E is a graph illustrating CI in the case where the angle ψ is changed. In FIG. 22E, the vertical axis on the left side of the graph indicates CI in C mode (unit: Ω), the vertical axis on the right side of the graph indicates CI in B mode and spurious (unit: Ω), and the horizontal axis indicates the angle ψ (unit: °). The same goes for the graphs illustrated in FIG. 23D and FIG. 24D, which will be described later. The excitation electrodes 24 and 25 are configured to have the width W1 of 0.7 (mm), the length L2 of 1.2 (mm), the interval g of 1.2 (mm), and the distance R of 2.4 (mm). In this embodiment, the interval g between the pair of excitation electrodes 24 and 25 in the Z'''-axis direction means a distance between the main portion 26 and a main portion of the excitation electrode 25 in the Z'''-axis direction. The same goes for the following embodiments.

As illustrated in FIG. 22D and FIG. 22E, it is confirmed that, with the piezoelectric vibrating piece 20, C1 in C mode becomes sufficiently higher than C1 in B mode at the angle ψ of 260° to 300°. Furthermore, it is confirmed that in the case where the angle ψ is 280°, C1 in C mode becomes 0.06 (fF) or more, CI in C mode becomes 200 (Ω) or less, and CI in B mode and spurious becomes almost around ten times of CI in C mode.

With such piezoelectric vibrating piece 20, the unnecessary vibrations can be effectively restrained only with the piezoelectric vibrating piece 20, in addition to the effect that ensures effectively restraining the B mode while sufficiently securing the excitation in C mode in the case where the angle ψ is set to 260° to 300°. To use the piezoelectric vibrating piece 20 for the piezoelectric device, this eliminates the need for the filter or a similar member for the piezoelectric device to restrain the B mode and the unnecessary vibrations. Accordingly, simplifying a circuit of the piezoelectric device allows improving the reliability and reducing the production cost.

Third Embodiment

Figure 23A:
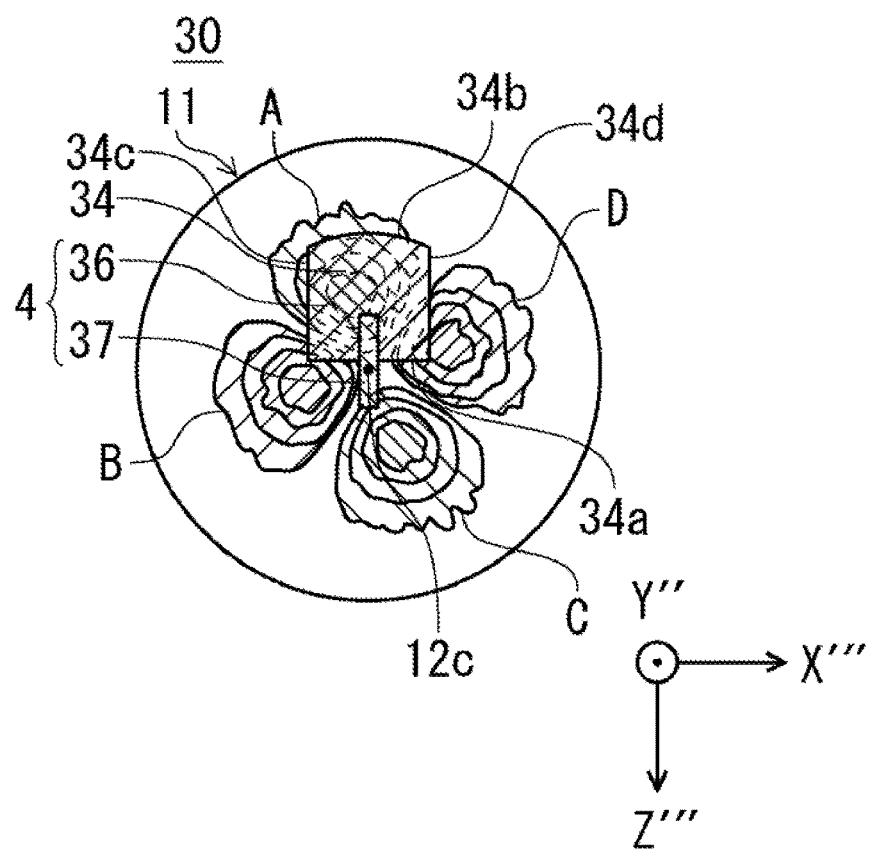
FIGS. 23A-23D illustrate an example of a piezoelectric vibrating piece according to a third embodiment.
Figure 23B:
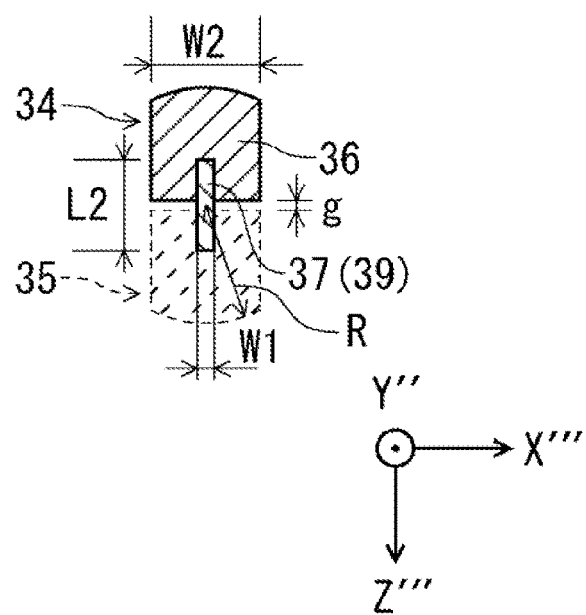

The following describes a piezoelectric vibrating piece according to the third embodiment with reference to the drawings. Like reference numerals designate corresponding or identical elements with the above-described embodiments, and therefore such elements will not be further elaborated here. FIGS. 23A-23D illustrate an example of the piezoelectric vibrating piece according to the third embodiment, FIG. 23A is the plan view, and FIG. 23B is a plan view of main parts.

As illustrated in FIG. 23B, a piezoelectric vibrating piece 30 includes a pair of excitation electrodes 34 and 35. The excitation electrode 34 is formed on the front surface 12a of the vibrator 12. The excitation electrode 35 is formed on the back surface 12b of the vibrator 12. The excitation electrode 35 is disposed symmetrically to the excitation electrode 34 with respect to a straight line parallel to the X'''-axis direction and passing through the center of the thickness at the center of the vibrating piece body 11 viewed from the Y''-axis direction. Accordingly, the following omits an explanation on configurations of the excitation electrode 35 similar to those of the excitation electrode 34.

The excitation electrode 34 is formed on the front surface 12a of the vibrator 12. The excitation electrode 34 includes a main portion 36 and a protrusion 37. The main portion 36 is formed in a region on the −Z'''-side of the front surface 12a of the vibrator 12. The main portion 36 is formed in a region shaped by notching each of a region including an end portion on the +X'''-side and a region including an end portion on the −X'''-side along the Z'''-axis direction of an approximately semicircular-shaped region similar to the excitation electrode 14 and in a region where the protrusion 37 is not disposed. The main portion 36 has a straight line part 34a parallel to the X''-axis direction at the end portion on the +Z'''-side. The main portion 36 includes an arc portion 34b on an end portion on the −Z'''-side. The excitation electrode 34 has two cutout parts 34c and 34d parallel to the Z'''-axis direction and have an identical length. The width of the main portion 36 in the X'''-axis direction (a distance between the cutout parts 34c and 34d) is set to W2. One or both of the cutout parts 34c and 34d may be formed along a direction inclined with respect to the X'''-axis direction. The two cutout parts 34c and 34d may be configured to have different lengths.

The protrusion 37 is formed projecting from the main portion 36 in the +Z'''-axis direction. The protrusion 37 is formed in a rectangular region that centers the center 12c of the vibrator 12 viewed from the Y''-axis direction and has side portions parallel to the Z'''-axis direction and the X'''-axis direction. The width of the protrusion 37 in the X'''-axis direction (a length of the side portions parallel to the X'''-axis direction) is set to W1, and a length in the Z'''-axis direction (a length of the side portions parallel to Z'''-axis direction) is set to L2. The protrusion 37 is formed so as to overlap a protrusion 39, which is formed on the back surface 12b of the vibrator 12, in the Y''-axis direction.

Since the main portion 36 has the shape formed by notching the region including the end portion on the +X'''-side and the region including the end portion on the −X'''-side, thereby restraining picking up the electric charges at the parts B and D. The protrusion 37 is formed in the region including the center 12c of the vibrator 12 where the C mode is strongly generated, thereby allowing securing the C1 value in C mode and allowing obtaining the larger C mode. Additionally, since this region picks up the electric charges with sign different from the parts B and D, this offsets the electric charges of spurious, thereby ensuring further restraining the unnecessary influence from the spurious.

Figure 23C:
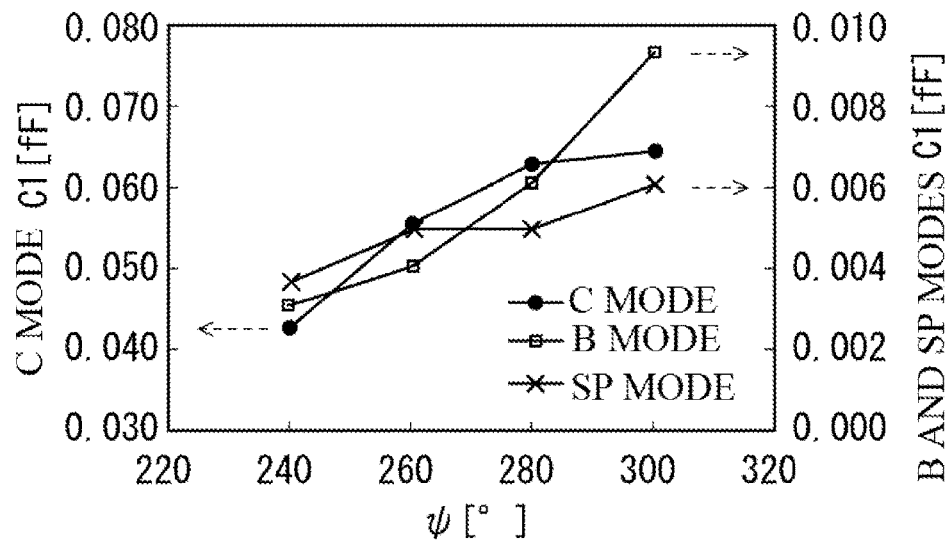
Figure 23D:
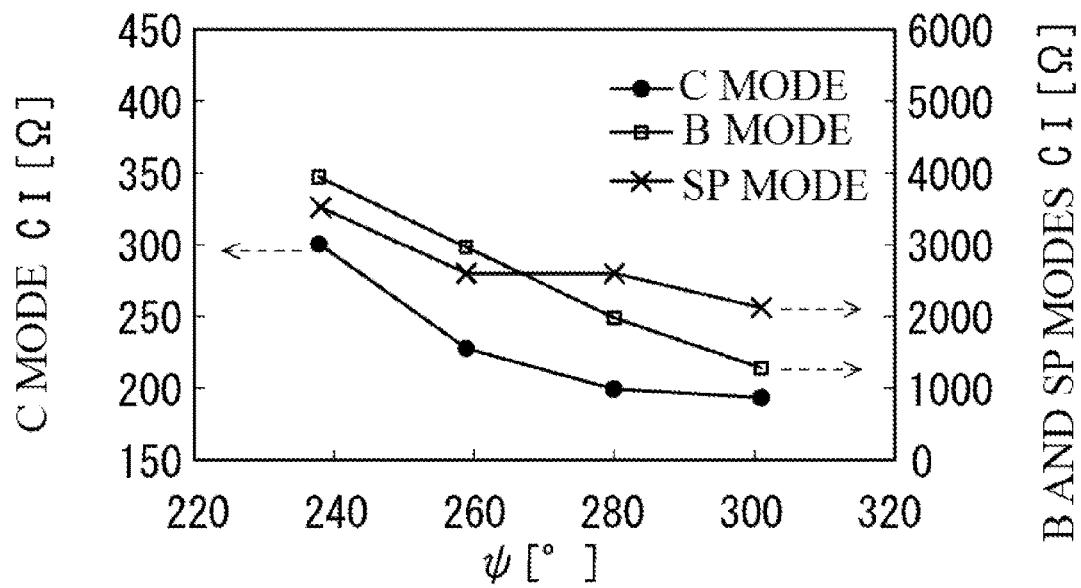

FIG. 23C and FIG. 23D are graphs illustrating the vibration characteristic of the piezoelectric vibrating piece 30. FIG. 23C is a graph illustrating C1 in the case where the angle N is changed. FIG. 23D is a graph illustrating CI in the case where the angle ψ is changed. As illustrated in FIG. 23C and FIG. 23D, it is confirmed that C1,CI in C mode becomes sufficiently higher than C1,CI in B mode at the angle ψ of 260° to 300°. Furthermore, it is confirmed that, with the angle ψ of 280°, C1 in C mode becomes 0.060 (fF) or more and CI in C mode becomes 200 (Ω) or less. It is confirmed that CI in B mode and the unnecessary vibrations becomes ten times or more of CI in C mode. The excitation electrodes 34 and 35 are configured to have the width W1 of 0.25 (mm), the width W2 of 2.0 (mm), the length L2 of 1.5 (mm), and the interval g of 0.1 (mm).

With such piezoelectric vibrating piece 30, the unnecessary vibrations can be further effectively restrained only with the piezoelectric vibrating piece 30, in addition to the effect that ensures effectively restraining the B mode while sufficiently securing the excitation in C mode in the case where the angle ψ is set to 260° to 300°. The use of such piezoelectric vibrating piece 30 for the piezoelectric device eliminates the need for the filter or a similar member to restrain the B mode and the unnecessary vibrations for the piezoelectric device. Accordingly, simplifying a circuit of the piezoelectric device allows improving the reliability and reducing the production cost.

Fourth Embodiment

Figure 24A:
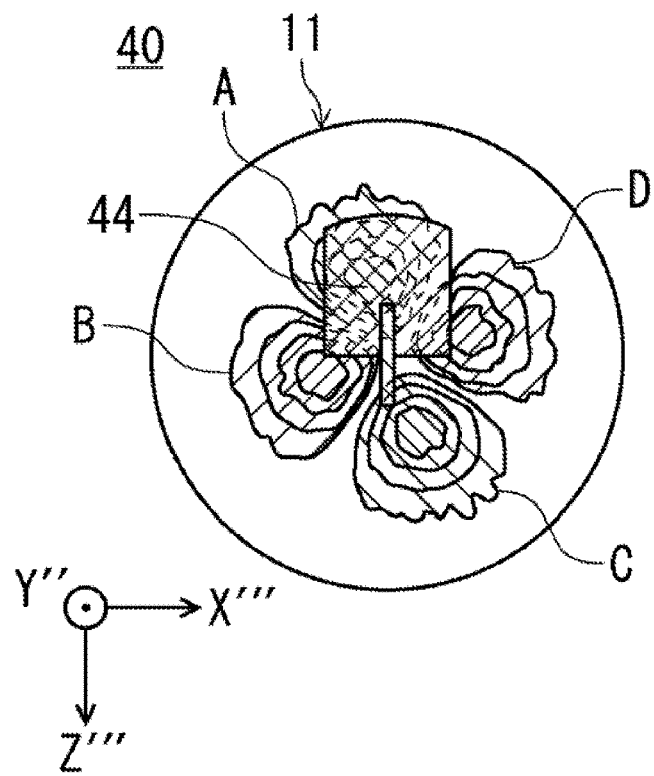
FIGS. 24A-24D illustrate an example of a piezoelectric vibrating piece according to a fourth embodiment.
Figure 24B:
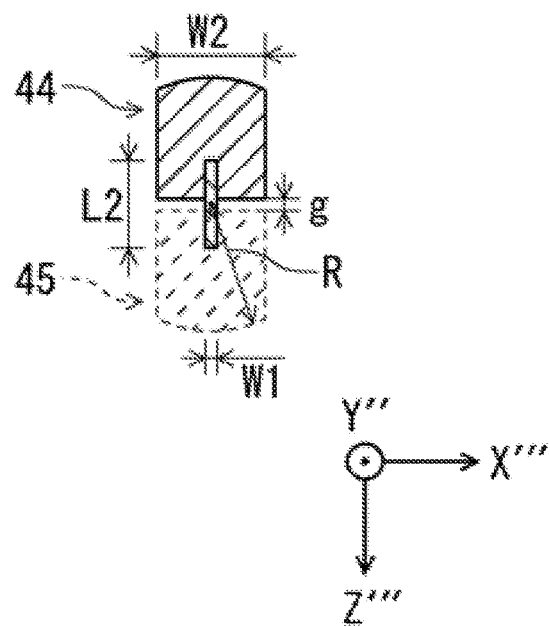

Subsequently, the following describes a piezoelectric vibrating piece according to the fourth embodiment with reference to the drawings. Like reference numerals designate corresponding or identical elements with the above-described embodiments, and therefore such elements will not be further elaborated here. FIG. 24A and FIG. 24B are an example of the piezoelectric vibrating piece according to the fourth embodiment, FIG. 24A illustrates the plan view, and FIG. 24B is a plan view of main parts of FIG. 24A.

Excluding dimensions of a pair of excitation electrodes, a piezoelectric vibrating piece 40 has a configuration identical to the above-described piezoelectric vibrating piece 30. Excitation electrodes 44 and 45 in the piezoelectric vibrating piece 40 are configured to have the width W1 of 0.2 (mm), the width W2 of 2.2 (mm), the length L2 of 1.8 (mm), and the interval g of 0.1 (mm). Compared with the excitation electrodes 34 and 35, the excitation electrodes 44 and 45 are configured to have the slightly shorter width W1 and the slightly longer width W2 and length L2.

Figure 24C:
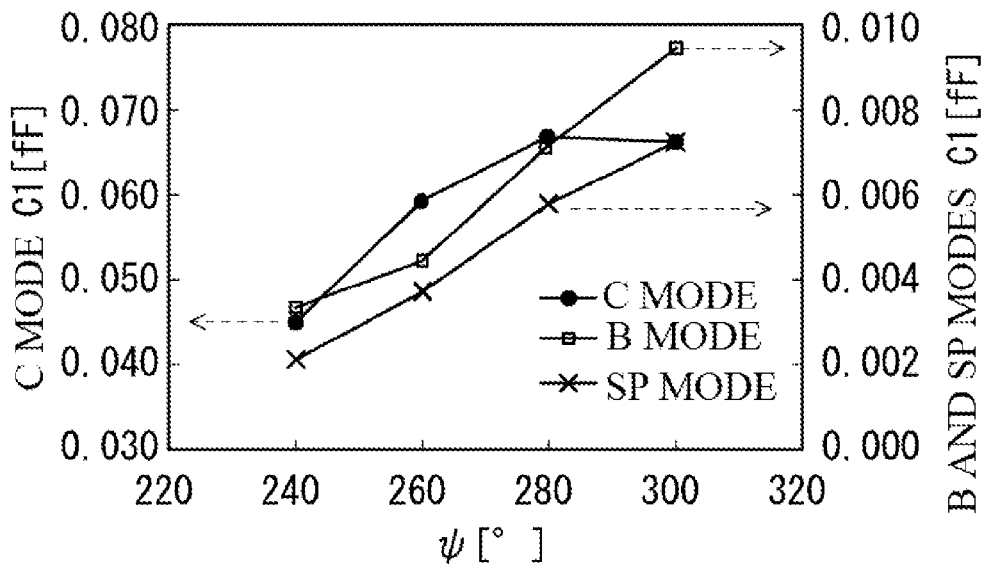
Figure 24D:
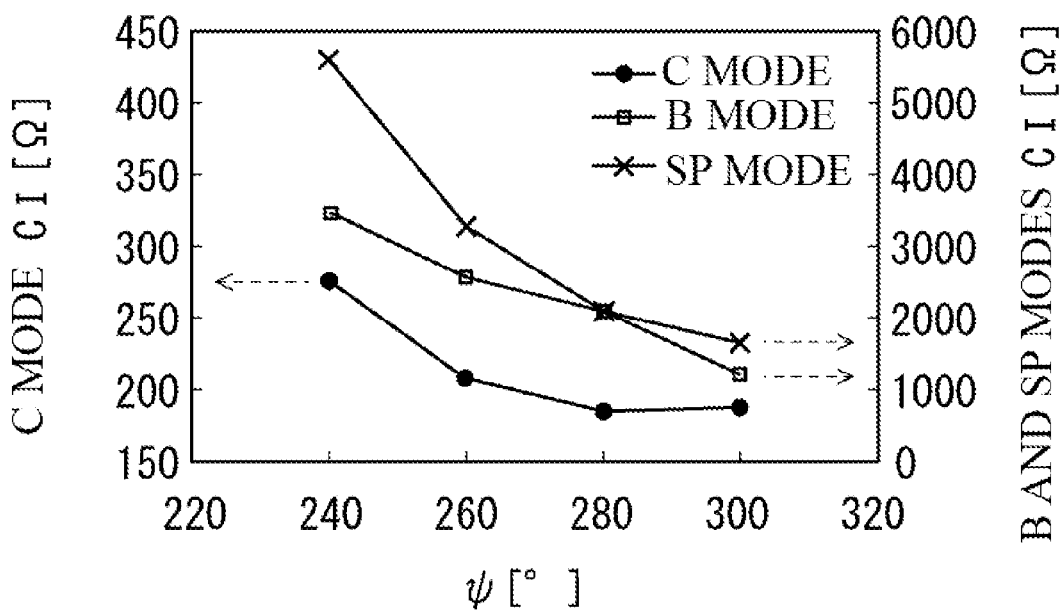

FIG. 24C and FIG. 24D are graphs illustrating the vibration characteristic of the piezoelectric vibrating piece 40. FIG. 24C is a graph illustrating C1 in the case where the angle ψ is changed. FIG. 24D is a graph illustrating CI in the case where the angle ψ is changed. As illustrated in FIG. 24C and FIG. 24D, it is confirmed that C1,CI in C mode becomes sufficiently higher than C1 in B mode at the angle ψ of 260° to 300°. Furthermore, it is confirmed that in the case where the angle ψ is 280°, C1 in C mode becomes 0.060 (fF) or more and CI in C mode becomes almost 200 (Ω) or less. Additionally, it is confirmed that CI in B mode and the unnecessary vibrations exceeds ten times of CI in C mode.

With such piezoelectric vibrating piece 40, the unnecessary vibrations can be further effectively restrained only with the piezoelectric vibrating piece 40, in addition to the effect that ensures effectively restraining the B mode while sufficiently securing the excitation in C mode in the case where the angle ψ is set to 260° to 300°. To use the piezoelectric vibrating piece 40 for the piezoelectric device, this eliminates the need for the filter or a similar member for the piezoelectric device to restrain the B mode and the unnecessary vibrations. Accordingly, simplifying a circuit of the piezoelectric device allows improving the reliability and reducing the production cost.

Fifth Embodiment

Figure 25:
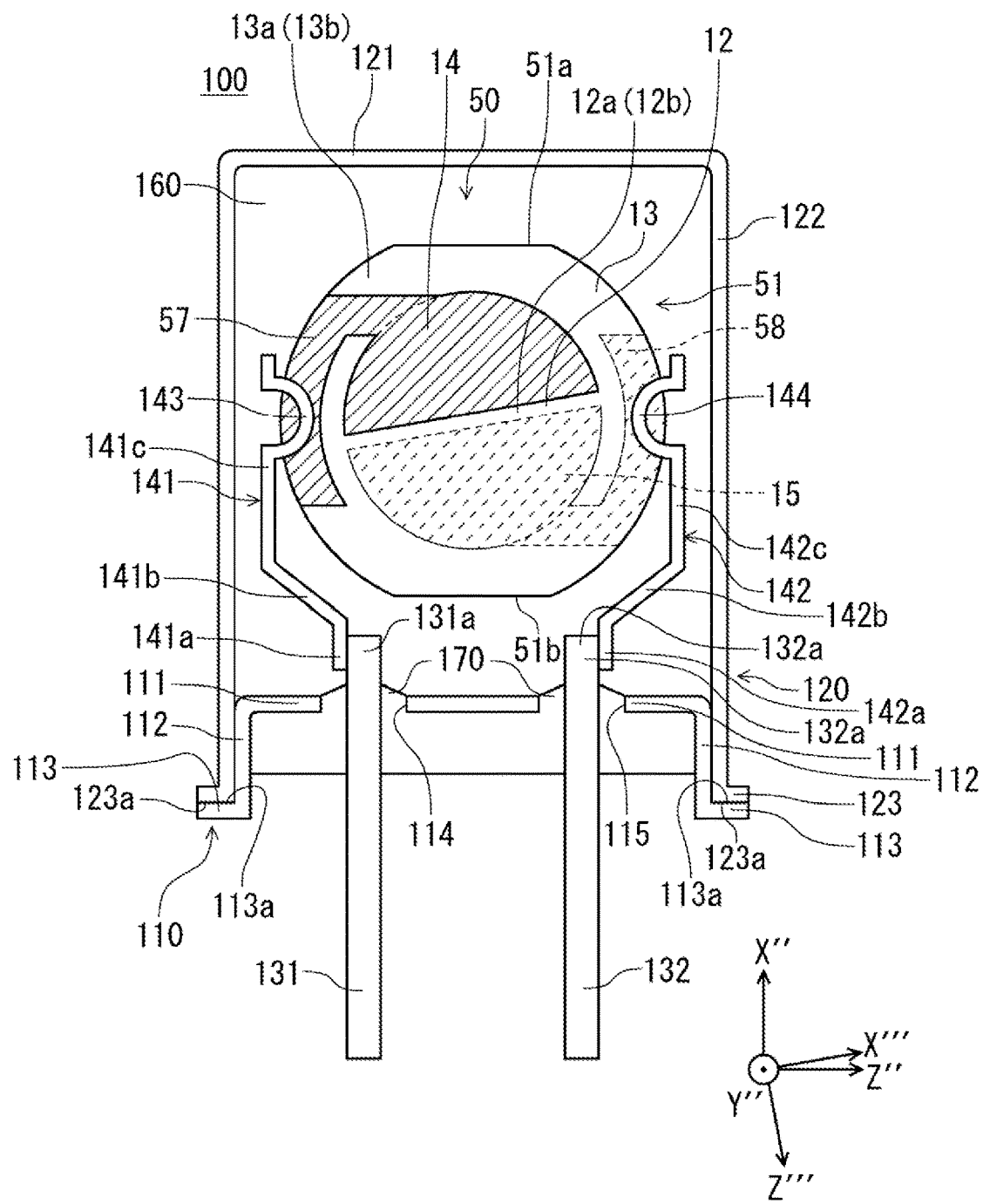
FIG. 25 is a cross-sectional view illustrating an example of a piezoelectric device according to a fifth embodiment.

The following describes one example of a piezoelectric device according to the fifth embodiment with reference to the drawings. As illustrated in FIG. 25, a piezoelectric device 100 includes a piezoelectric vibrating piece 50, a base 110, a cover 120, leads 131 and 132, and supporters 141 and 142. This piezoelectric device 100 is a piezoelectric resonator. For the base 110 and the cover 120, a metallic plate-shaped member made of, for example, copper (Cu), iron (Fe), nickel (Ni), 42 alloy, and kovar are employed. Instead of metal, for the base 110 and the cover 120, for example, ceramics (an aluminum compound and a similar compound), silicon, glass, and resin, which are low price and easily formed, may be employed.

As illustrated in FIG. 25, the piezoelectric vibrating piece 50 includes a vibrating piece body 51, the pair of excitation electrodes 14 and 15, and extraction electrodes 57 and 58. The vibrating piece body 51 has cutouts 51a and 51b notched along the X"-Y" plane on the respective end portions on the +X"-side and the −X"-side. Whether to dispose the cutouts 51a and 51b or not is optional.

The excitation electrodes 14 and 15 are formed on the front surface 12a and the back surface 12b (the surfaces on the ±Y"-sides) of the vibrator 12 of the vibrating piece body 51. The angle ψ is set to 280°. The angle ψ is not limited to 280° and may be any angle in a range of 260° to 300°. The extraction electrode 57 is disposed on the front surface (a surface on the +Y"-side) 13a of the peripheral portion 13 of the vibrating piece body 51. The extraction electrode 57 is extended from the excitation electrode 14 to the −Z"'-direction and is formed up to a side surface on the −Z"-side of the vibrating piece body 51. The extraction electrode 58 is disposed on the back surface (a surface on the −Y"-side) 13b of the peripheral portion 13 of the vibrating piece body 51. The extraction electrode 58 is extended from the excitation electrode 15 to the +Z"-direction and is formed up to a side surface on the +Z"-side of the vibrating piece body 51. The extraction electrodes 57 and 58 are configured integrally with and made of the metal film similar to the excitation electrodes 14 and 15; however, the configuration is not limited to this.

The supporters 141 and 142 support the piezoelectric vibrating piece 50 in a housing space 160, which is formed of the base 110 and the cover 120. Holders 143 and 144 of the supporters 141 and 142 support the end portions on the +Z"-side and the −Z"-side of the piezoelectric vibrating piece 50. The piezoelectric vibrating piece 50 is stood with respect to the base 110 such that the planes forming the excitation electrodes 14 and 15 become parallel to the X"-Z" plane. However, the arrangement is not limited to one illustrated in the drawing. The piezoelectric vibrating piece 50 may be disposed inclined with respect to the X"-Z" surface or may be parallel to the Y"-Z" plane. The piezoelectric vibrating piece 50 is not limited to be held by the end portions on the +Z"-side and the −Z"-side but may be held by other parts. The extraction electrodes 57 and 58 of the piezoelectric vibrating piece 50 are bonded on the holders 143 and 144 via conductive adhesive (not illustrated). This secures electrical connection between the respective excitation electrodes 14 and 15 and the supporters 141 and 142.

The base 110 has planar portions (surfaces on the +X"-side) 111, tubular trunk portions 112, and collar portions 113. The planar portion 111 is formed into an oval shape viewed from the X"-direction. The trunk portions 112 extend from the peripheral areas of the planar portions 111 in the −X"-direction. The collar portions 113 project from the end portions of the trunk portions 112 to the outside. Bonding surfaces 113a to be bonded to bonding surfaces 123a, which will be described later, of the cover 120 are formed on surfaces on the +X"-side of the collar portions 113. The base 110 may also have, for example, a circular shape or a polygonal shape other than a quadrangular shape viewed from the X"-direction.

The planar portions 111 of the base 110 have two through holes 114 and 115 passing through the base 110 in a thickness direction (the X"'-direction). The leads 131 and 132 are formed so as to be inserted through the through holes 114 and 115, respectively. After the leads 131 and 132 are inserted through the through holes 114 and 115, sealing materials 170 are filled. Thus, a hermetic sealing is performed on the through holes 114 and 115. This hermetic sealing secures the leads 131 and 132 to the base 110. As the sealing material 170, a non-conductive material such as a glass material and a resin material is employed. Therefore, even if a conductive material such as metal is employed for the base 110, the electrical connection between the base 110 and the leads 131 and 132 is prevented. Together with the hermetic sealing on the through holes 114 and 115 with the glass material or a similar material, the inside of the base 110 may be filled with, for example, resin.

The cover 120 has a planar portion (a surface on the +X"-side) 121, a tubular trunk portion 122, and collar portions 123. The trunk portion 122 extends from the peripheral area of the planar portion 121 in the −X"-direction. The collar portion 123 projects from the end portion of the trunk portion 122 to the outside. At the trunk portion 122, the trunk portion 112 of the base 110 is fittably formed. The bonding surfaces 123a to be bonded to the bonding surfaces 113a of the base 110 are formed on surfaces on the −X"-side of the collar portions 123. The cover 120 is not limited to the above-described configuration. Any given shape with which the cover 120 is bonded together with the base 110 to form the housing space 160 may be applied.

The bonding surfaces 113a of the base 110 and the bonding surfaces 123a of the cover 120 are bonded together by resistance welding such as seam welding and spot welding. The housing space 160, which is formed by bonding the base 110 and the cover 120 together, houses the piezoelectric vibrating piece 50. The housing space 160 is configured to be inactive atmosphere with respect to the piezoelectric vibrating piece 50 such as vacuum atmosphere or nitrogen gas. The base 110 and the cover 120 may be bonded together using various bonding materials instead of the bonding by welding.

For the leads 131 and 132, which are disposed in the through holes 114 and 115, for example, a conductive metallic material such as copper, an alloy of iron and nickel, kovar, and a stainless steel is used. The respective supporters 141 and 142 are mounted to distal end portions 131a and 132a, which are parts extending from the planar portions 111 of the base 110 in the +X"-direction (inner leads), of the leads 131 and 132. Parts of the leads 131 and 132 extending from the base 110 in the −X"-direction (outer leads) are employed as external terminals for electrical connection to a substrate or a similar component. The supporter 141 includes a connecting portion 141a, which extends in the +X"-direction, a bending portion 141b, a straight line portion 141c, which extends in the +X"-direction, and the holder 143, which is formed at a part of the straight line portion 141c. Similarly, the supporter 142 includes a connecting portion 142a, a bending portion 142b, a straight line portion 142c, and the holder 144.

The piezoelectric vibrating piece 50 is secured to and electrically connected to the respective holders 143 and 144 via the conductive adhesive. As the conductive adhesive, for example, epoxy-based, silicon-based, polyimide-based, or urethan-based adhesive is employed.

Subsequently, the following describes an example of a method for fabricating the piezoelectric device 100. First, each of the base 110 that includes the leads 131 and 132 to which the supporters 141 and 142 are bonded together, the cover 120, and the piezoelectric vibrating piece 50 are prepared. Almost similar to the above-described piezoelectric vibrating piece 10, the piezoelectric vibrating piece 50 that includes the extraction electrodes 57 and 58 on predetermined regions of the front surfaces is prepared. Subsequently, the piezoelectric vibrating piece 50 is inserted between the supporters 141 and 142 and the end portions on the +Z"-side and the −Z"-side are fitted to slits of the holders 143 and 144. Subsequently, the conductive adhesive is applied over the holders 143 and 144 to secure the piezoelectric vibrating piece 50 to the holders 143 and 144, thus electrically connecting the extraction electrodes 57 and 58 to the supporters 141 and 142.

Next, under the vacuum atmosphere, the trunk portions 112 of the base 110 are fitted to the trunk portion 122 of the cover 120. Subsequently, the resistance welding is performed on the bonding surfaces 113a of the base 110 with the bonding surfaces 123a of the cover 120. This bonds the base 110 and the cover 120 together to form the housing space 160, and the housing space 160 is airtightly sealed in a vacuum state. The piezoelectric device 100 is completed through the above-described processes.

The piezoelectric vibrating piece and the piezoelectric device that includes the piezoelectric vibrating piece according to the present invention have been described above. The present invention is not limited to the above-described explanation, and various changes may be made without departing from the spirit of the present invention. For example, a combination of the configurations of the above-described embodiments may be employed. The pair of excitation electrode 14 or a similar electrode and excitation electrode 15 or a similar electrode are formed symmetrically with respect to the straight line parallel to the X'"-axis direction and passing through the center of the thickness of the center 12c of the vibrating piece body 11 or a similar member viewed from the Y"-axis direction. However, the configuration is not limited to such symmetrical formation. For the vibrating piece body 11 and a similar member, a cut different from the SC cut, M-SC cut, and IT cut may be applied. The piezoelectric device 100 is not limited to the piezoelectric resonator that houses only the piezoelectric vibrating piece. The piezoelectric device 100 may be a piezoelectric oscillator with which an IC chip including an oscillator circuit is packed, a piezoelectric filter that connects the piezoelectric vibrating piece according to the present invention to the column, and a similar product.

DESCRIPTION OF REFERENCE SIGNS g . . . interval
t . . . thickness
10, 10a, 20, 30, 40, 50 . . . piezoelectric vibrating piece
11, 51 . . . vibrating piece body
12 . . . vibrator
12a . . . front surface
12b . . . back surface
14, 14A, 15, 15A, 24, 25, 34, 35, 44, 45 . . . excitation electrode
14a, 15a, 24a, 25a, 34a . . . straight line part
27, 29, 37, 39 . . . protrusion
100 . . . piezoelectric device

The invention claimed is:
1. A piezoelectric vibrating piece, comprising:
a vibrating piece body, including a vibrator; and
at least a pair of excitation electrodes, being formed on a front surface and a back surface of the vibrator, respectively,
wherein,
the vibrating piece body is a doubly rotated quartz-crystal vibrating piece cut out parallel to an X"-Z" surface, the X"-Z" surface being rotated around a Z-axis of a crystallographic axis of a crystal and further rotated around an X'-axis; and
the pair of excitation electrodes are collocated in a Z'"-axis direction determined by an X'"-axis, the X'"-axis being defined by counterclockwise rotation from a +X"-axis direction around a Y"-axis by 260° to 300°, the pair of excitation electrodes being disposed inclined with respect to an Y"-axis direction.
2. The piezoelectric vibrating piece according to claim 1, wherein
an interval of the pair of excitation electrodes in the Z'"-axis direction is defined as g, and a thickness of the vibrator is defined as t,
g/t is set to 0.183 to 0.366.
3. The piezoelectric vibrating piece according to claim 1, wherein
the pair of excitation electrodes are disposed so as to partially overlap in the Y"-axis direction.

4. The piezoelectric vibrating piece according to claim 1, wherein
   a direction of the X'''-axis is configured in a range of 260° to 280° rotation from an X''-axis direction around the Y''-axis.

5. The piezoelectric vibrating piece according to claim 1, wherein
   the vibrating piece body employs an SC cut, an M-SC cut, or an IT cut.

6. The piezoelectric vibrating piece according to claim 1, wherein
   the pair of excitation electrodes are each formed into a semicircular shape,
   the pair of excitation electrodes being disposed such that straight line parts of the excitation electrodes are opposed to or overlap with one another viewed from the Y''-axis direction.

7. The piezoelectric vibrating piece according to claim 1, wherein
   the pair of excitation electrodes are each formed to offset an induced electric charge, the induced electric charge being generated by an unnecessary vibration vibrating at a frequency different from a desired frequency.

8. The piezoelectric vibrating piece according to claim 1, wherein
   the pair of excitation electrodes each include a protrusion, the protrusions overlapping in the Y''-axis direction.

9. A piezoelectric device, comprising
   the piezoelectric vibrating piece according to claim 1.

* * * * *